United States Patent
Wohl et al.

(10) Patent No.: US 12,320,839 B2
(45) Date of Patent: Jun. 3, 2025

(54) DISTRIBUTED TEST PATTERN GENERATION AND SYNCHRONIZATION

(71) Applicant: Synopsys, Inc., Sunnyvale, CA (US)

(72) Inventors: Peter Wohl, Williston, VT (US); Khader Abdel-Hafez, Sunnyvale, CA (US); Michael Dylan Dsouza, Sunnyvale, CA (US)

(73) Assignee: Synopsys, Inc., Sunnyvale, CA (US)

( * ) Notice: Subject to any disclaimer, the term of this patent is extended or adjusted under 35 U.S.C. 154(b) by 353 days.

(21) Appl. No.: 17/937,206

(22) Filed: Sep. 30, 2022

(65) Prior Publication Data

US 2024/0110973 A1   Apr. 4, 2024

(51) Int. Cl.
*G01R 31/28* (2006.01)

(52) U.S. Cl.
CPC .............. *G01R 31/2834* (2013.01)

(58) Field of Classification Search
CPC .............. G01R 31/2834; G06F 30/398; G06F 11/3676; G06F 11/3688; G06F 2115/12
See application file for complete search history.

(56) References Cited

U.S. PATENT DOCUMENTS

| | | | |
|---|---|---|---|
| 2004/0153978 A1* | 8/2004 | Xiang | G06F 30/30 716/103 |
| 2007/0226570 A1* | 9/2007 | Zou | G01R 31/318342 714/741 |
| 2012/0079440 A1* | 3/2012 | Akar | G06F 30/33 716/106 |
| 2015/0347664 A1* | 12/2015 | Goel | G06F 30/398 716/112 |

* cited by examiner

*Primary Examiner* — Giovanni Astacio-Oquendo
*Assistant Examiner* — Haidong Zhang
(74) *Attorney, Agent, or Firm* — Weaver Austin Villeneuve & Sampson LLP

(57) ABSTRACT

Techniques for performing efficient automatic test-pattern generation (ATPG) are disclosed. ATPG may be performed by ATPG workers whose fault states are synchronized by an ATPG manager. In some embodiments, test-pattern generation by a ATPG worker may be performed multiple times with minimal idle time between generation and fault simulation intervals. Synchronization schemes may be synchronous or asynchronous. In asynchronous schemes, an ATPG worker may determine staleness of its fault state. If the fault state is stale, the ATPG worker may poll the ATPG manager to update the fault state to the current fault state of the ATPG manager which includes information on faults detected (including duplicate faults) by other ATPG workers. In synchronous schemes, fault states may be synchronized without polling by the ATPG worker. The synchronization of fault states via communication between manager and workers may reduce duplication and idle time, hence improving the time efficiency of ATPG workers.

20 Claims, 12 Drawing Sheets

DISTRIBUTED TEST PATTERN GENERATION AND SYNCHRONIZATION

TECHNICAL FIELD

The present disclosure generally relates to electronic design automation (EDA) systems, and, more particularly, to a system and method for efficient automatic test-pattern generation (ATPG).

BACKGROUND

Automatic test-pattern generation (ATPG) is a technique used to find an input test sequence to determine correct circuit behavior and the faulty circuit behavior caused by defects. ATPG is crucial to silicon quality and product life cycle. Example use cases include testing semiconductor devices after manufacture, and assisting with determination of the cause of failure. The mechanics of ATPG include obtaining a compact pattern set that can be applied to silicon to ensure intended functionality. During the pre-silicon design flow, test-pattern generation is run multiple times to ensure the compact pattern set is achievable. As designs grow ever larger, test-pattern generation time also grows and can impact time-to-market. Hence, an efficient mechanism for test-pattern generation is desirable.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
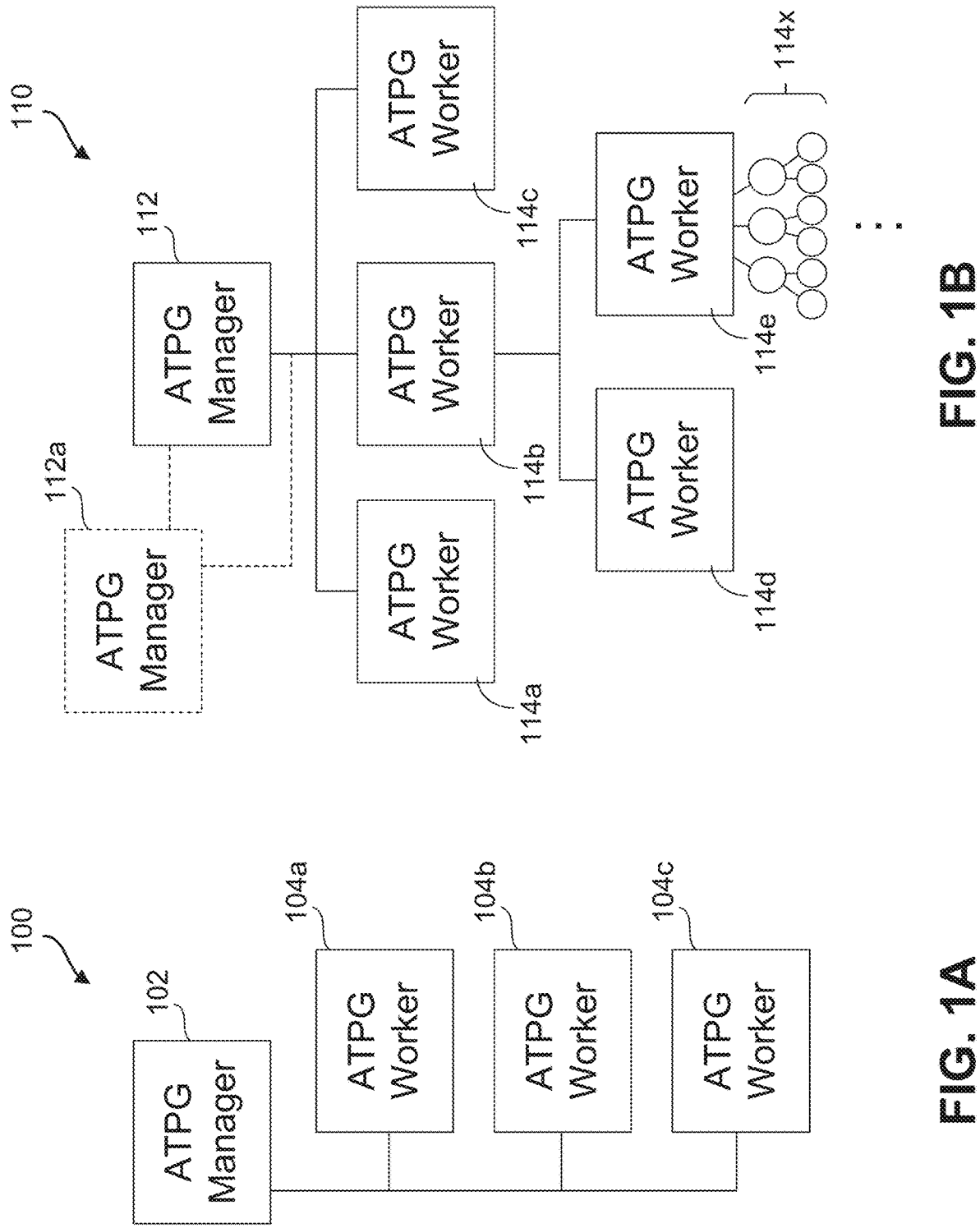
FIGS. 1A and 1B are block diagrams illustrating example relationships between ATPG managers and ATPG workers, according to some embodiments.

There have been multiple approaches to using powerful hardware to speed up test-pattern generation. A first example is usage of multiple threads to utilize all the cores of a central processing unit (CPU). A second example is implementing distributed networks of CPUs (also referred to as "cloud computing"). A third example is using specialized hardware (e.g., graphics processing units (GPUs)) to speed up some parts of test-pattern generation (such as simulation), but with limited impact on the overall process. However, the architectures of prior implementations are limited to tens of machines and could not extend the benefits to more (e.g., hundreds) of machines.

In the context of the present disclosure, a "machine" may refer to a set of hardware (e.g., one or more processing devices (e.g., CPU, GPU, ASIC), one or more cores of one or more processing devices, logic, integrated circuit, or a combination thereof) that is configured to perform a specific task or application. In some cases, a "machine" may at least partly refer to one or more software components of such hardware. The hardware and/or software may utilize computational resources such as threads. As examples, an "ATPG manager" is a machine that synchronizes work performed and/or to be performed by a machine referred to as an "ATPG worker." One or more processor cores of an ATPG worker may generate test patterns and/or detect faults using one or more threads. As another example, one or more processor cores of an ATPG manager may receive messages from ATPG workers and consolidate information on detected faults using one or more threads.

ATPG has goals of high test coverage to ensure quality of semiconductor devices, low pattern count to reduce test cost, low CPU time to reduce time to market, and predictability of results so that ATPG runs during the design cycle are indicative of the final result. However, the challenge is that focusing on any one of the above goals can degrade the results of the other goals. As an example, the steps involved in the ATPG process may include: (1) Test generation creates one or more test patterns targeting as many faults as possible. (2) Good-machine simulation (where the circuit is simulated as is, under an assumption that the system logic is defect-free) and fault simulation determine the faults actually detected by the patterns generated in step 1. These include most of the fault targeted by the test generator, as well as many other faults that are fortuitously detected. In the context of the present disclosure, "fortuitous detection" may refer to the detection of non-targeted or unmodeled defects and faults. (3) The faults detected are removed from the list of targeted faults, and step 1 is repeated as long as there are undetected or unexplained faults.

Step 3 above can be considered an information-management task that can be relatively fast. Step 2 can be parallelized so that it can also run relatively fast. This leaves step 1, test generation, as the main impediment to efficient ATPG.

One may approach this challenge by generating many test patterns in parallel to speed up the process. However, this would be very inefficient because, lacking the "clean up" of steps 2 and 3 which involve removal of known faults, the many parallel test-generation tasks will duplicate work by testing faults that would have been detected by another test pattern. ATPG is a sequential process that includes repeated test generation and fault-simulation tasks.

For enhanced time efficiency, parallel test-generation may benefit from organized communication between machines organized by hierarchy (e.g., ATPG manager and ATPG worker as depicted in FIGS. 1A and 1B) to minimize duplication of work. However, too much communication may slow down the ATPG process, because the communication network between machines may be limited in bandwidth and thus experience large delays. On the other hand, too little communication may not reduce the wasted effort sufficiently and may result in unpredictable results.

Additionally, test generation for some "hard" faults can take orders of magnitude longer than for "easy" faults, making it difficult to load balance parallel test generation and to utilize all machines simultaneously. Finally, cloud resources are unpredictable, as machines can have very different speeds and can fail in the middle of a task. Nonetheless, the ATPG system must produce the goals noted above.

To these ends, aspects of the present disclosure relate to distributed ATPG for an EDA system by utilizing one or more ATPG managers that synchronize the test-pattern generation by one or more distributed ATPG workers to improve run time. More specifically, a parallel test-generation system is used to reduce or minimize duplication of work, while balancing the costs of communication between ATPG managers and workers. In a synchronous approach, ATPG workers may generate patterns independently and/or at unequal amounts, while the ATPG manager may consolidate all ATPG worker patterns at regular intervals. In an asynchronous approach, ATPG workers may generate patterns independently and/or at unequal amounts, while the ATPG manager may consolidate some or all ATPG worker faults and patterns at asynchronous intervals. Both synchronous and asynchronous approaches can enhance time and resource efficiency during ATPG. As will become clearer below, the asynchronous approach may additionally and advantageously maximize the CPU usage efficiency of the workers while reducing or minimizing the "staleness" of the worker's fault states, allowing maximization of the parallelism achieved while generating a compact pattern sets by reducing duplication of work across the workers. Staleness can refer to a worker state in which coverage of test patterns slows down or does not move. In other words, if test patterns being generated have been previously covered, then there is a significant chance that the patterns are no longer useful to test. Hence, an ATPG worker may measure a degree of staleness of its worker state. To illustrate basic interactions between ATPG managers and ATPG workers, the following describes relationships therebetween.

FIG. 1A is a block diagram 100 illustrating an example relationship between an ATPG manager 102 and multiple ATPG workers 104a-104c, according to some embodiments. As shown, the ATPG manager 102 may communicate with each of the ATPG workers 104a-104c in parallel. In some cases, the ATPG workers 104a-104c may not be in communication with one other.

FIG. 1B is a block diagram 110 illustrating an example relationship between an ATPG manager 112 and multiple ATPG workers 114a-114e and 114x, according to some embodiments. In some embodiments, the ATPG manager 112 may communicate directly with some ATPG workers 114a-114c in parallel. However, at least some ATPG workers 114d, 114e may be in communication with one ATPG worker 114b. In turn, further ATPG workers 114x may further be in communication with one ATPG worker 114e, in a branching manner. In some embodiments, the ATPG manager 112 may be able to send and receive signals and commands to downstream workers, e.g., 114d, 114e, 114x.

In some embodiments, a secondary ATPG manager 112a may be configured for communication with the ATPG manager 112. While the secondary ATPG manager 112a may be configured to perform the same managerial tasks as the ATPG manager 112 (e.g., listening for new worker fault detections, communicating a worker fault detections to other workers, and other tasks as will be detailed below), the secondary ATPG manager 112a may "shadow" the ATPG manager 112 and be on standby in case the ATPG manager 112 fails. In some cases, the secondary ATPG manager 112a may temporarily or permanently replace the ATPG manager 112 and, e.g., manage the ATPG workers 114a-114e and 114x. In some cases, the secondary ATPG manager 112a may temporarily or permanently manage a subset of the ATPG workers 114a-114e and 114x. The functionality or operation of ATPG manager 112 may be restored in the meantime and take over its original functions or continue operation on the remaining ones of the ATPG workers not managed by the secondary ATPG manager 112a.

Figure 2:
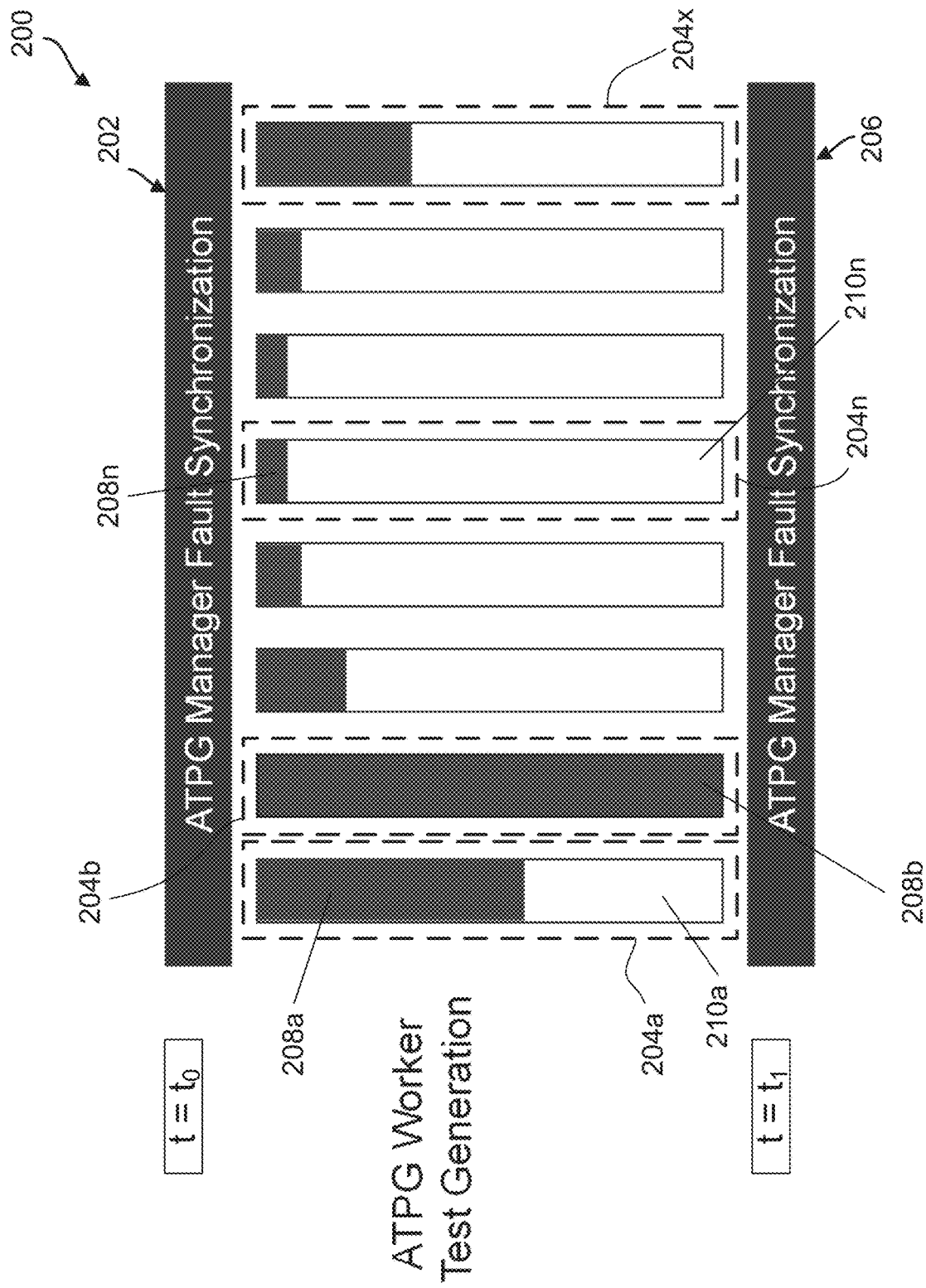
FIG. 2 is a block diagram illustrating an ATPG mechanism, according to some embodiments.

FIG. 2 is a block diagram illustrating an ATPG mechanism 200, according to some embodiments. In some embodiments, the ATPG mechanism 200 comprises two tightly coupled operations: test generation to create a set of test patterns, and simulations (e.g., good-machine simulation and fault simulation) to detect faults. As shown, a distributed ATPG mechanism 200 is able to employ ATPG workers in parallel to generate test patterns at regular intervals measured in a quantity of generated patterns in order to guarantee reproducibility. That is, all worker processes perform equal amounts of work, synchronized at regular intervals. More specifically, the ATPG mechanism 200 may enable a first fault synchronization 202 to be performed by an ATPG manager at some time to before test-pattern generation by ATPG workers 204a-204x, and a second fault synchronization 206 to be performed by the ATPG manager at some time $t_1$ after the test-pattern generation. For example, during a period 208a, an ATPG worker 204a may (i) perform test-pattern generation to produce an amount of test patterns and (ii) perform fault detection on them. An ATPG worker 204b may perform test-pattern generation in parallel with the ATPG worker 204a (and the other ATPG workers) and produce an amount 208b of test patterns and perform fault detection. Similarly, an ATPG worker 204n and the final ATPG worker 204x may produce respective amounts of test patterns and perform fault detection. Note, however, that there are periods of unproductivity. While the ATPG worker 204b generates test patterns, the ATPG worker 204a is idle during a period 210a. As another example, the ATPG worker 204n is idle during a period 210n, a period of time that is many multiple of a period of time 208n used for generating test patterns. Although there are multiple ATPG workers working to generate test patterns, this ATPG mechanism 200 has room for improvements in efficiency, e.g., to reduce the lengthy idle periods of time that are not used for generating test patterns, even while ensuring minimization of duplicate work arising from testing faults that would have been detected by another test pattern.

Such improvements may be effectuated by focusing on the distribution of the work among numerous machines with one or more machines being designated as one or more ATPG managers, while a typically much larger number of machines is designated as ATPG workers. While the above example utilizes an ATPG manager and ATPG workers, intercommunication between an ATPG manager and ATPG workers may be established with a setup flow that distributes the process of building the design database, reaching a state where all ATPG managers and ATPG workers have the same exact software view of the design (e.g., entire netlist of the design), before distributing the process of test pattern generation and good/fault simulation. Moreover, in some embodiments, both ATPG managers and ATPG workers may be able to perform ATPG pattern generation and ATPG fault simulation, with the ATPG managers synchronizing the efforts to reduce duplication.

This approach may ensure predictability without enforcing identical results in each run, which would severely limit speed-up achievable on a large number of machines (e.g., hundreds or thousands). Enabling test-coverage checks to be performed fast and often ensures that a more compact pattern set can reach similar coverage in a final run that would otherwise require a much longer time to complete.

Figure 3:
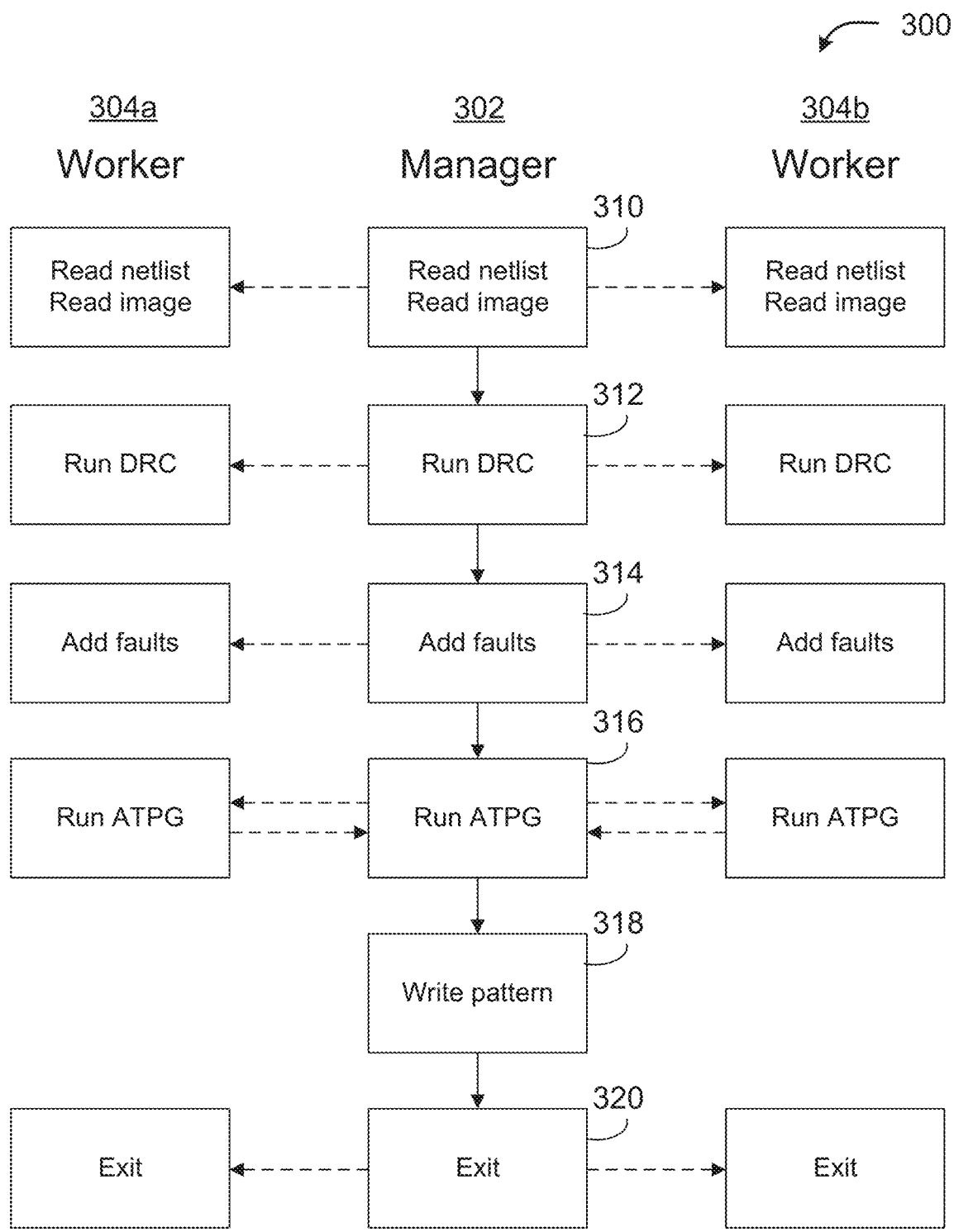
FIG. 3 is a block schematic depicting operational relationships between an ATPG manager and one or more ATPG workers, according to some embodiments.

FIG. 3 is a block schematic 300 depicting operational relationships between an ATPG manager 302 and one or more ATPG workers 304a, 304b, according to some embodiments. In some embodiments, one or more ATPG managers (e.g., ATPG manager 302) and ATPG workers (e.g., 304a, 304b) are set up as illustrated in FIG. 3. Each machine associated with the ATPG manager 302 and each of the ATPG workers 304a, 304b starts at the beginning of a script and executes the same steps to build a netlist, run a design rule check (DRC), and so on.

At block 310, the ATPG manager 302 may read a netlist and an image of the circuit design to be tested. The ATPG manager 302 may simultaneously or subsequently instruct the ATPG workers 304a, 304b to perform the same.

At block 312, the ATPG manager 302 may run a DRC, a set of rules used by a designer to ensure the schematic matches all manufacturing considerations and dimensional tolerances set for a board. Running a DRC may involve physical verification, including checking the layout design to ensure that manufacturing constraints are correct, such as DRC constraints, electrical constraints, lithographic constraints, etc. The ATPG manager 302 may simultaneously or subsequently instruct the ATPG workers 304a, 304b to perform the same.

At block 314, the ATPG manager 302 may add faults to a fault list, or infer all faults in a design. The ATPG manager 302 may simultaneously or subsequently instruct the ATPG workers 304a, 304b to perform the same.

At block 316, the ATPG manage 302 may run ATPG. ATPG may involve test-pattern generation and fault detection. The ATPG manager 302 may simultaneously or subsequently instruct the ATPG workers 304a, 304b to perform the same. In some embodiments, this ATPG may be a distributed ATPG, which may be synchronous or asynchronous, as will be described in more detail below. Notably, the ATPG manager 302 and the ATPG workers 304a, 304b communicate to improve the efficiency of the ATPG process.

At block 318, based on the ATPG, the ATPG manager 302 may finalize and write the circuit pattern for the design, and exit the process at block 320 for the ATPG manager 302 and the ATPG workers 304a, 304b.

Synchronous ATPG

Figure 4:
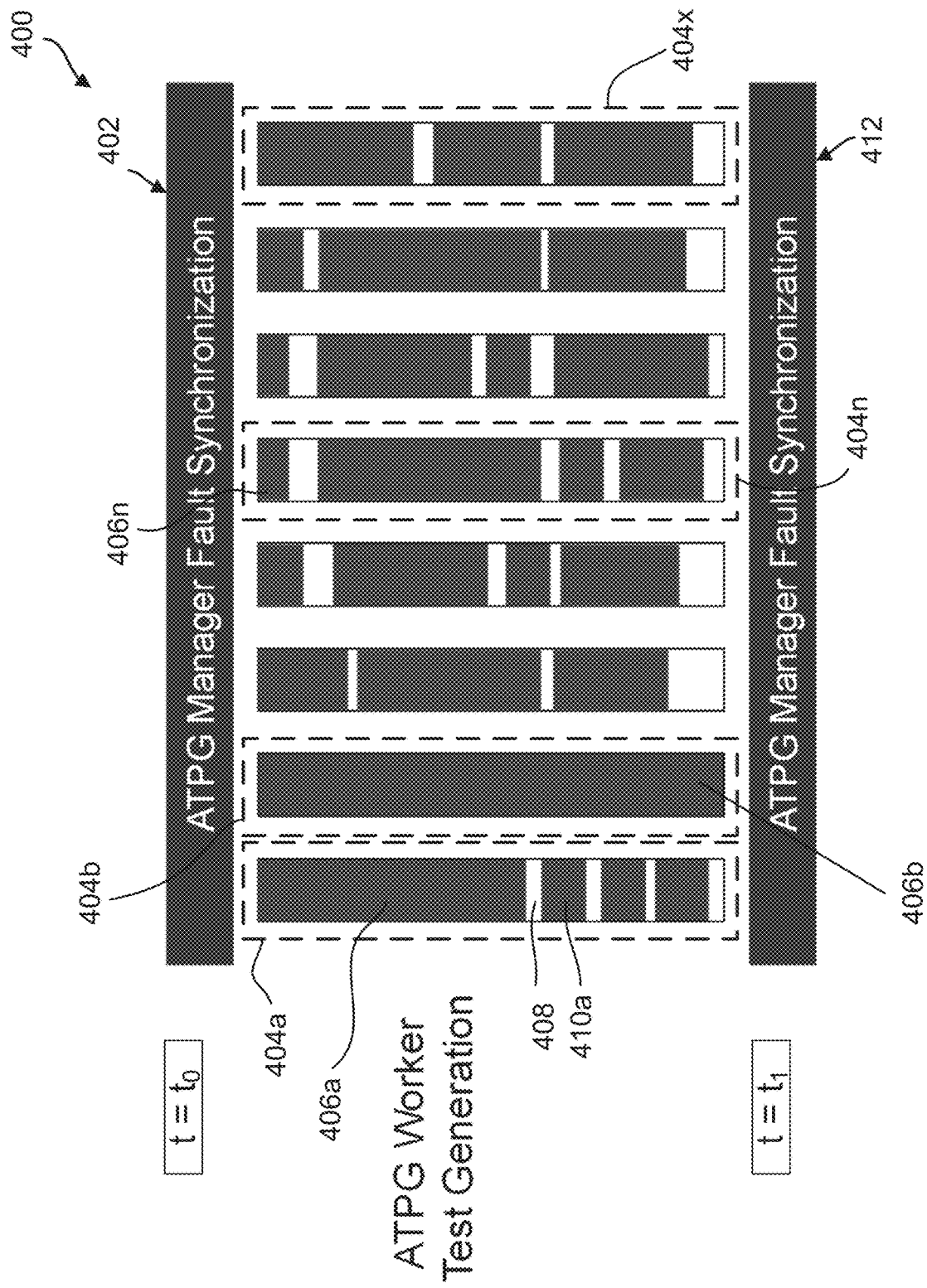
FIG. 4 is a block diagram illustrating an example synchronous ATPG mechanism, according to some embodiments.

FIG. 4 is a block diagram illustrating a synchronous ATPG mechanism 400, according to some embodiments. In some embodiments, the ATPG mechanism 400 comprises the operations of test generation to create a set of test patterns, and simulations (e.g., good-machine simulation and fault simulation) to detect faults. ATPG workers 404a-404x managed by an ATPG manager may generate patterns independently, in parallel, while the ATPG manager may consolidate all ATPG worker patterns at certain points in time.

More specifically, in some approaches, ATPG workers 404a-404x may be assigned minimum and maximum pattern generation targets, a quantity which may be different for different workers. In some implementations, the maximum pattern target may be undefined and may effectively be limitless.

In some embodiments, the minimum and maximum pattern generation targets may be learned and modified during ATPG using ad hoc or machine learning techniques. For example, the minimum target for ATPG worker 404a may be increased or decreased based on, e.g., an amount of duplicate work produced relative to other ATPG workers, machine capabilities of the ATPG worker (e.g., CPU clock speed, GPU clock speed, memory), or manual setting.

In some implementations, machine learning may be utilized to determine the minimum and maximum pattern generation targets. For example, data from some or all ATPG workers may be collected to be used as input for training a machine learning model. Such data may include amount of work performed (e.g., number of test patterns generated) over a prescribed period of time by each ATPG worker, number of faults detected over a period of time (including statistical information such as the average number), the shortest or longest period of time needed to complete the test-pattern generation, computational resources used to complete generation of a prescribed number of test patterns, among other types of data. This data and/or additionally collected data may then be used with a learning function such as a linear or nonlinear regression model to determine a computationally efficient minimum or maximum pattern generation target. In some instances, a loss optimization function such as gradient descent may be used to determine such targets. In other cases, other optimization criteria may be set for the targets, e.g., time-efficient minimum or maximum pattern generation target.

In some embodiments, the minimum and maximum pattern generation targets may be fixed throughout ATPG. In some embodiments, the minimum and maximum pattern generation targets may be equal; i.e., the minimum pattern target may be the same as the maximum pattern target.

As an aside, pattern generation and fault simulation can include one or more additional criteria that need to be taken into consideration in addition to performing the fault detection task inherent in pattern generation. Examples of such criteria include pattern generation while meeting the power requirements of a design, pattern generation while considering timing exceptions of a design, and pattern generation while taking any other characteristics of the design which must be honored.

In some embodiments, synchronization by the ATPG manager of work performed by ATPG workers may occur when some or all machines (e.g., selected ones of the ATPG workers 404a-404x) have reached their minimum pattern target. Synchronization by the ATPG manager may include stopping pattern generation of the machines for some or all of the ATPG workers 404a-404x, which limits pattern inflation (increase in the number patterns required to detect the faults) when reaching the ATPG worker maximum target. For the ATPG manager to be aware that ATPG workers have reached their minimum pattern target, the ATPG workers may communicate with the ATPG manager. The ATPG manager may thereby be aware that the ATPG workers have completed the test-pattern generation and fault detections, and be aware of the fault detections by the ATPG workers.

Based on this information, the ATPG manager may become aware of duplicate fault detections, which may, e.g., set up the ATPG manager to reduce overtesting and significantly speed up the ATPG process.

Referring back to FIG. 4, in some scenarios, an ATPG manager may start a new interval at time $t_0$ and instruct ATPG workers (e.g., 404a-404x) to begin the ATPG process to generate test patterns, at a synchronization step 402. An example ATPG worker 404a may generate test patterns and detect faults associated therewith during a period 406. In some implementations, each ATPG worker, including the example ATPG worker 404a, may generate an interval's worth of patterns and perform fault simulation on the generated patterns. In some cases, an interval may be defined based on an amount of memory (e.g., 32 bits of patterns), or in cases where different patterns take different amounts of memory, based on a number of patterns. In some cases, an interval may be an interval of time.

In some implementations, the ATPG worker may generate up to at least a minimum pattern generation target, which may have been determined according to one or more of the above-described approaches. In some cases, the minimum pattern generation target may be a number specific and unique to at least the ATPG worker 404a. In some implementations, the minimum pattern generation target may be the same for all selected ATPG workers (e.g., some or all of 404a-404x).

Another ATPG worker 404b may independently generate test patterns and perform fault simulation to detect faults associated with the test patterns, during a period 406b. For different reasons, the test patterns generated by ATPG worker 404b may be an amount that is unequal to that generated by ATPG worker 404a during the aforementioned period 406a. For instance, the ATPG worker 404b may have a different (e.g., greater) minimum pattern generation target, or the computational resources (e.g., cores, threads) may be different than those of the ATPG worker 404a and result in a different level of productivity, or the defined interval has passed. As shown in FIG. 4, the ATPG worker 404b may do an amount of work 406b for a period of time longer than the period of time for an amount of work 406a performed by the ATPG worker 404a. This creates an idle period of time 408 for ATPG worker 404a. However, this idle period of time 408 may be much shorter than it would be in the ATPG mechanism 200 depicted in FIG. 2.

However, unlike the ATPG mechanism 200 of FIG. 2, the ATPG manager of the synchronous ATPG mechanism 400 may be aware of the work that is independently performed by ATPG workers 404a and 404b and that these workers have reached the minimum pattern target based on a message from the each of the ATPG workers. Hence, the ATPG manager may instruct the ATPG worker 404a to stop pattern generation, and the ATPG worker 404a may be assigned and begin a new pattern generation during a period 410a subsequent to the idle period 408. Further idle times and pattern generation periods may occur for ATPG worker 404a. Similar approaches may be implemented to introduce productivity during idle times for other ATPG workers, e.g., ATPG workers 404n, 404x.

In some scenarios, the ATPG manager may determine which faults are detected by only one worker and which faults are detected by several workers. In general, it is desirable that ATPG mechanisms detect faults once to reduce duplication of work. The ATPG manager may select a worker to give fault detection credit to. The ATPG manager may grant credit to one of the ATPG workers based on, e.g., a priority list of workers (a worker may be given higher priority or importance than others), a first-come-first-served approach, or a random or pseudorandom determination. Those having ordinary skill in the art may recognize various other approaches to selecting a worker to reduce duplication of work. The work done by the other(s) may be discarded to reduce duplicate fault detections.

In some embodiments, the above continues and repeats until a terminating criterion is reached. At that point, the ATPG manager may signal all ATPG workers to stop, and may collect all generated patterns at a synchronization step 412 at time $t_1$. Referring back to the example of ATPG workers 404a and 404b, each of these ATPG workers may not be aware of the fault state (and hence the work done by other workers) until a synchronization event 412. ATPG worker 404a, for example, may be aware of previous work done. In some embodiments, the ATPG manager may update all workers with the faults detected by other workers, including the faults that were detected by several workers and given credit to a single worker. That is, when the ATPG worker 404a is performing work during the period 410a, it is aware of the patterns generated and/or faults detected during period 406a. This awareness can reduce duplicate work by a given ATPG worker (404a), but not another ATPG worker (e.g., 404b). Nonetheless, time and resource efficiencies are advantageously achieved by virtue of communication between an ATPG worker and an ATPG manager to enable the ATPG worker to continue to do work until a criterion is reached, and synchronize when, e.g., the last ATPG worker completes its work.

At time $t_1$, the ATPG manager may instruct the ATPG workers 404a-404x to perform a second "pass" of fault simulations, repeating the work similar to above where the ATPG manager waits for the ATPG workers 404a-404x to complete fault simulation. In some cases, one or more additional synchronization events may occur at future times $t_2$, $t_3$, etc.

Asynchronous ATPG

Figure 5A:
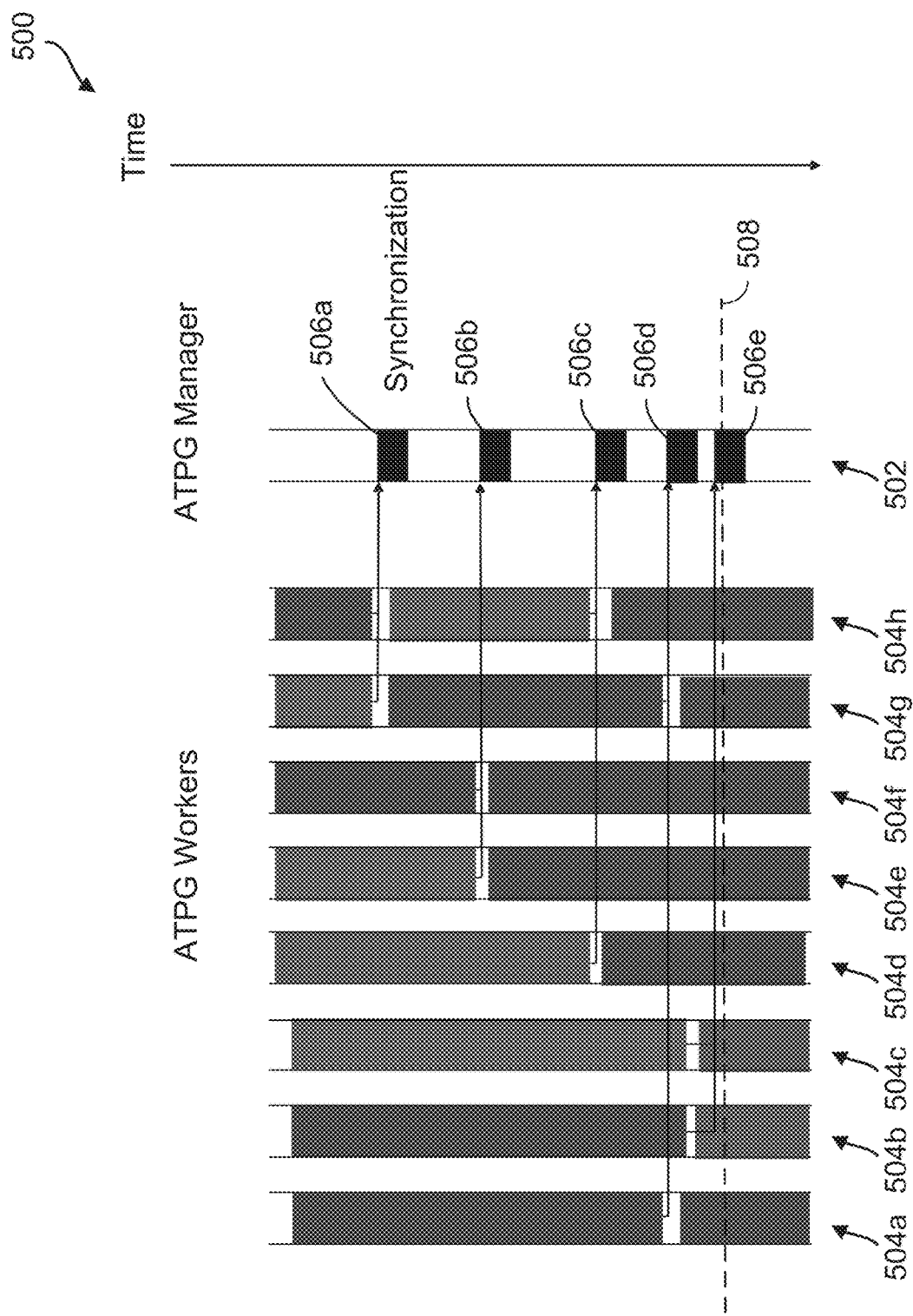
FIGS. 5A and 5B are block diagrams illustrating example asynchronous ATPG mechanisms, according to some embodiments.

FIG. 5A is a block diagram illustrating an asynchronous ATPG mechanism 500, according to some embodiments. In some embodiments, the ATPG mechanism 500 comprises the operations of test generation to create a set of test patterns, and simulations (e.g., good-machine simulation and fault simulation) to detect faults. More specifically, ATPG workers 504a-504h managed by an ATPG manager 502 may generate patterns independently, in parallel, while the ATPG manager may consolidate the work of at least some ATPG worker patterns at certain points in time.

More specifically, in some approaches, ATPG workers 504a-504h may generate an interval's worth of patterns and perform fault simulation on the generated patterns. The ATPG workers 504a-504h may communicate new fault detections to the ATPG manager 502 after performing the fault simulation. Each ATPG worker may communicate its work and findings to the ATPG manager 502 independently of other ATPG workers.

As the ATPG manager 502 listens for new fault detections polled from ATPG workers 504a-504h, it can communicate previously undetected fault detections to the polling ATPG workers. Further, in order to limit communication, ATPG workers 504a-504h may be configured to only synchronize fault information with the ATPG manager 502 when the worker identifies that the worker's fault state has become too stale, causing duplication of ATPG efforts.

Staleness can refer to a worker state in which coverage of test patterns slows down or does not move. In other words, if test patterns being generated have been previously covered, then there is a significant chance that the patterns are no longer useful to test. Hence, each ATPG worker 504a-504h may measure a degree of staleness of its worker state. A worker's fault state may be determined to be stale based on, e.g., an amount of difference between an ATPG worker's fault state and the ATPG manager's fault state relative to a threshold, or an amount of coverage of test patterns relative to a prescribed threshold amount of test patterns generated by an ATPG worker. For instance, the worker fault state may be considered stale if the coverage of newly detected faults associated with test patterns generated by an ATPG worker does not exceed a threshold amount. Alternatively, if the coverage of duplicate faults detected by the ATPG worker exceeds a threshold amount, the fault state of the worker may be considered stale. In some implementations, since the ATPG manager is aware of the patterns generated and the faults detected, the threshold may be based on this knowledge. That is, the threshold may increase or decrease depending on the extent of faults discovered.

In some implementations, machine learning may be utilized to determine the threshold. For example, data from some or all ATPG workers may be collected to be used as input for training a machine learning model. Such data may include amount of work performed (e.g., number of test patterns generated) over a prescribed period of time by each ATPG worker, number of faults detected over a period of time (including statistical information such as the average number), a quantity of duplicate faults detected, a quantity of newly detected faults, structural information extracted from the design (e.g., scan cell input cone size, clock-gating architecture, scan cell output cone size, fanout-free region size, gate types), computational resources used to complete generation of a prescribed number of test patterns, among other types of data. This data and/or additionally collected data may then be used with a learning function such as a linear or nonlinear regression model to determine a computationally efficient threshold. In some instances, a loss optimization function such as gradient descent may be used to determine the threshold.

Referring back to the example of FIG. 5A, some ATPG workers (e.g., 504g and 504h) may complete its work (pattern generation and fault detection) at approximately similar times. These ATPG workers may communicate their fault detections to the ATPG manager 502. During a synchronization period 506a, the ATPG manager 502 may update its fault state, which includes information on patterns generated by all ATPG workers it manages and/or faults detected by these ATPG workers. The ATPG manager 502 may further update the fault states of ATPG workers 504g, 504h that have polled the ATPG manager 502 by communicating the fault state such that the polling workers and the ATPG manager 502 have the same fault state and thereby become aware of the current state of faults detected. This way, ATPG worker 504h may become aware of faults detected by ATPG worker 504g and vice versa.

Similarly, during synchronization periods 506b, 506c and 506d, various groups of workers may be updated with the then-current fault state. In the FIG. 5A example, at synchronization period 506c, the ATPG worker 504h may receive a second update. By synchronization period 506d, all ATPG workers except for 504b and 504c may have received communication regarding the fault state. At time 508, ATPG manager 502 may receive fault detections from ATPG workers 504b, 504c. However, ATPG manager 502 may be in the process of communicating fault state to ATPG workers 504a, 504g. In such a case, work performed by ATPG workers 504b, 504c may be left in a queue. Once the ATPG manager 502 completes the ongoing synchronization, e.g., during synchronization period 506d, it may proceed to update the ATPG workers associated with the queue (e.g., 504b, 504c) during synchronization period 506e.

In some scenarios, the same fault(s) may be detected by several ATPG workers, and the ATPG manager 502 may select a worker to give fault detection credit to. When there is more than one ATPG worker communicating fault detections as depicted in FIG. 5A, the ATPG manager 502 may grant credit to one of the ATPG workers based on, e.g., a priority list of workers (a worker may be given higher priority or importance than others), a first-come-first-served approach, or a random or pseudorandom determination. Those having ordinary skill in the art may recognize various other approaches to selecting a worker to reduce duplication of work. The work done by the other(s) may be discarded to reduce duplicate fault detections.

An "on demand" asynchronous mechanism such at this may reduce unbalanced worker and unbalanced fault problems, and may allow the ATPG workers to make progress in their work at their own pace (in irregular but equal amounts of work) and be able to efficiently use runtime and computational resources.

Figure 5B:
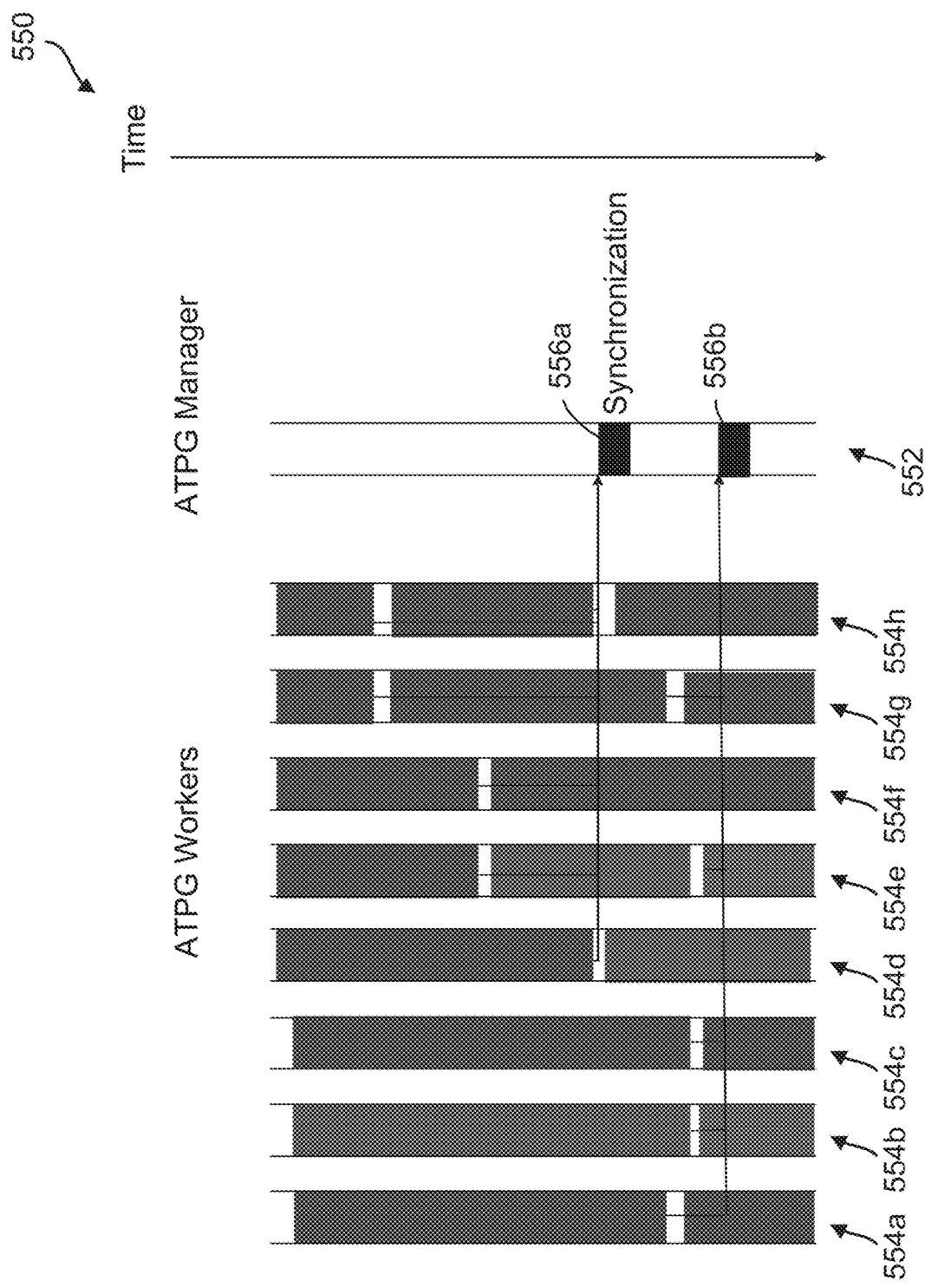

FIG. 5B is a block diagram illustrating another asynchronous ATPG mechanism 550, according to some embodiments. In some embodiments, the ATPG mechanism 550 comprises the operations of test generation to create a set of test patterns, and simulations (e.g., good-machine simulation and fault simulation) to detect faults. More specifically, ATPG workers 554a-554h managed by an ATPG manager 552 may generate patterns independently, in parallel, while the ATPG manager may consolidate the work of at least some ATPG worker patterns at certain points in time.

More specifically, in some approaches, ATPG workers 554a-554h may generate an interval's worth of patterns and perform fault simulation on the generated patterns. The ATPG workers 554a-554h may communicate new fault detections to the ATPG manager 552 after performing the fault simulation. Each ATPG worker may communicate its work and findings to the ATPG manager 552 independently of other ATPG workers.

As the ATPG manager 552 listens for new fault detections polled from ATPG workers 554a-554h, it can communicate previously undetected fault detections to the polling ATPG workers. Further, in order to limit communication, ATPG workers 554a-554h may be configured to only synchronize fault information with the ATPG manager 552 when the worker identifies that the worker's fault state has become too stale, causing duplication of ATPG efforts.

To even further limit communication and increase computational efficiency, synchronization events may be limited. In some implementations, ATPG workers may communicate their fault detections to the ATPG manager 552 based on a prescribed criterion. In some implementations, the criterion may be a threshold (e.g., minimum) number of ATPG workers that have completed their work (e.g., an interval of pattern generation and fault simulation). In some implementations, the criterion may be at least one ATPG worker completing more than one interval of pattern generation and fault simulation (e.g., completing two intervals). In some implementations, the criterion may be a period of time since initialization (e.g., 5 minutes). In some implementations, the criterion may be the completion of an interval by a certain ATPG worker. In some implementations, the criterion may be an amount of work done by the ATPG workers managed by the ATPG manager. In some cases, the ATPG workers may still send signals to the ATPG manager that they have completed their intervals, or they may send information about generated patterns and fault detections, but the ATPG manager may wait for the prescribed criterion to be met before synchronizing, e.g., updating its fault state and the fault states of ATPG workers.

As an illustrative example, ATPG workers 554g and 554h may have completed their intervals (e.g., fault detection of generated test patterns) and ahead of other ATPG workers. However, this work may be stored or queued, e.g., at an associated memory or buffer. That is, the fault detections (if any) are not yet communicated to the ATPG manager. ATPG workers 554e and 554f may complete their intervals next and similarly not communicate any fault detections to the ATPG manager. Subsequently, fault detections may be performed by ATPG workers 554d and 554h. At this point, the ATPG workers that have completed their work (554d-554h) may communicate information on generated test patterns and fault detections during a synchronization period 556a. During the synchronization period 556a, the ATPG manager 552 may update its fault state and fault states of the ATPG workers that have signaled the ATPG manager 552.

This synchronization period 556a may have been triggered by the number of ATPG workers completing their intervals (e.g., five ATPG workers 554d-554h), an amount of time that has passed since initializing the ATPG manager and workers, the ATPG worker 554h completing a second interval, the ATPG worker 554d completing its interval, or a total amount of work collectively done by the ATPG workers.

A subsequent synchronization period 556b may have been triggered in similar manners, e.g., five ATPG workers 554a, 554b, 554c, 554e, 554g completing their work; the ATPG worker 554e completing a second interval; or the ATPG worker 554a, 554b or 554c completing its interval.

While similar to the asynchronous ATPG mechanism 500 of FIG. 5A, the FIG. 5B variation may limit communication between machines to synchronize irregular and unequal amounts of work. Limiting communication may also reduce queuing during synchronization periods. However, more memory may be used to store pattern and fault information before fault states are updated by the ATPG manager. Moreover, less-frequent synchronization of fault states may cause duplication of faults detected by the ATPG workers.

Quantitative data shows that ATPG using the approaches described herein has dramatically sped up ATPG for large circuit designs. In some cases, what was previously a multi-week run could be obtained overnight. In an ATPG scenario with 100 workers and 16 threads per worker, a speedup of up to over 115-fold was observed, with varying and diminishing returns with greater workers in some cases. More typically, speedups are usually less than the number of workers, for example, a 20-fold speedup when using a 50-worker configuration.

Methods

Figure 6:
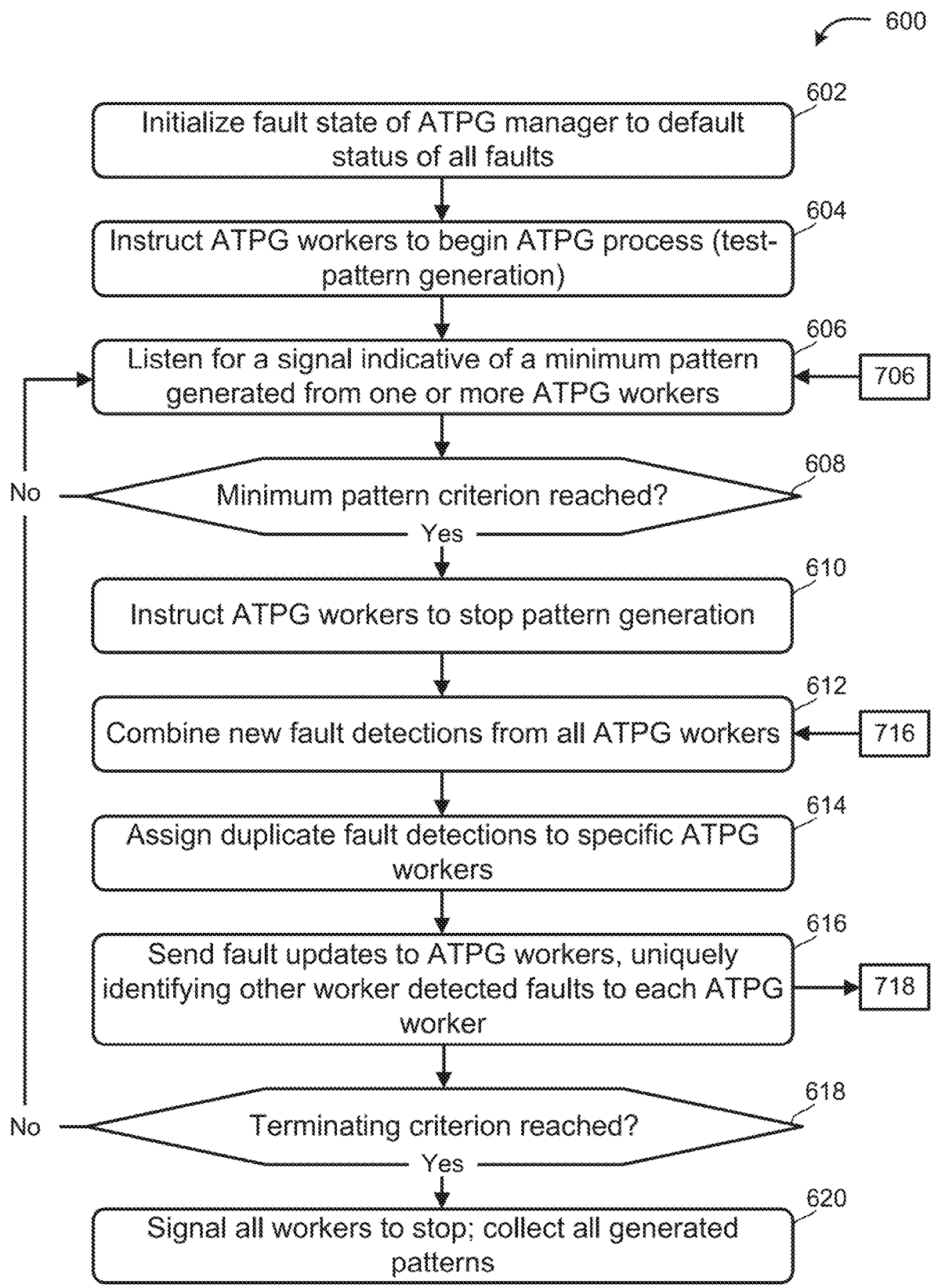
FIG. 6 is a flow diagram illustrating an example methodology for performing a synchronous ATPG by an ATPG manager, according to some embodiments.
Figure 11:
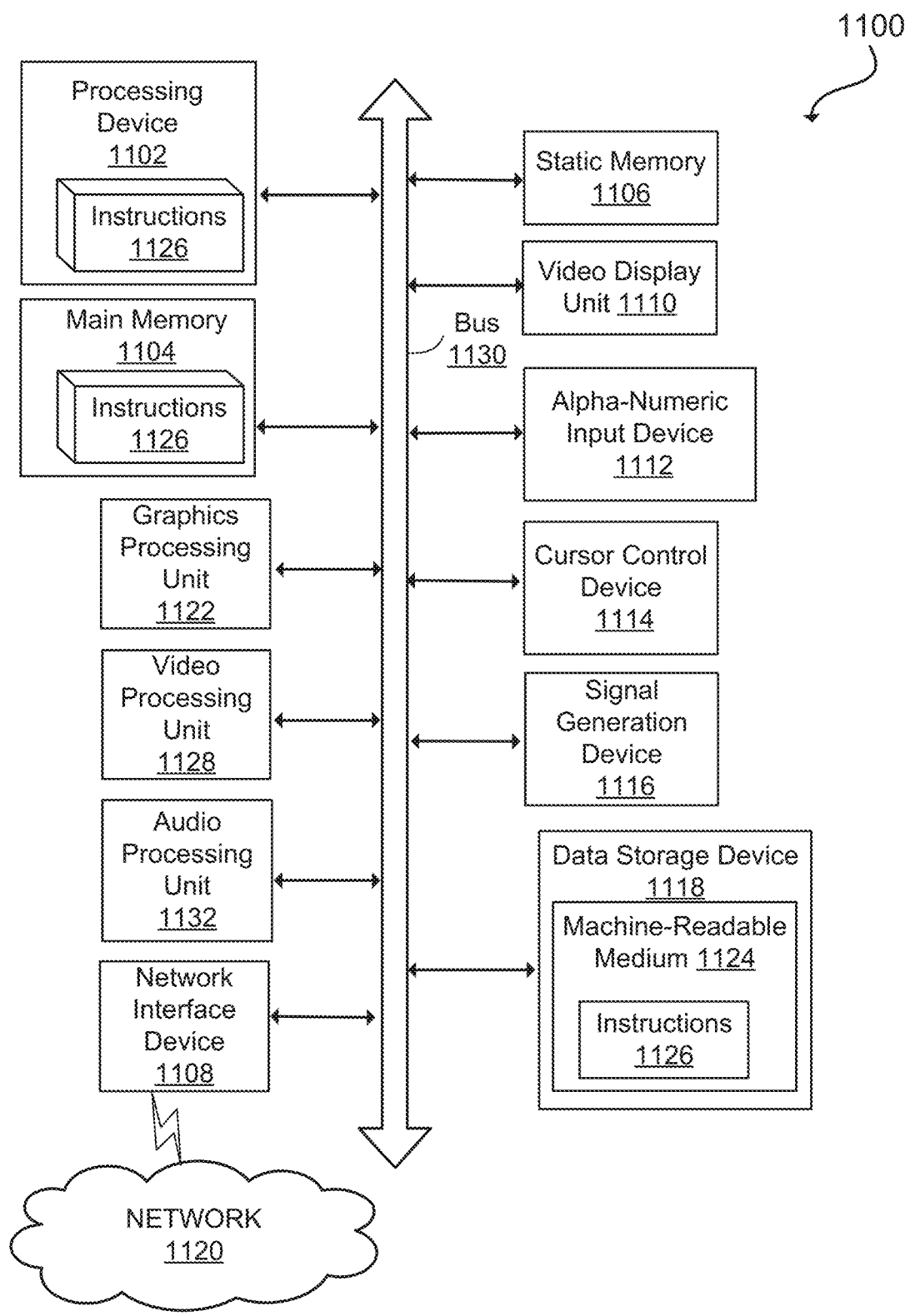
FIG. 11 depicts a diagram of an example computer system in which embodiments of the present disclosure may operate.

FIG. 6 is a flow diagram illustrating a methodology 600 for performing a synchronous automatic test-pattern generation (ATPG) by an ATPG manager, according to some embodiments. One or more of the functions of the method 600 may be performed by a computerized apparatus or system. Means for performing the functionality illustrated in one or more of the steps shown in FIG. 6 may include hardware and/or software components of such computerized apparatus or system, such as, for example, a device, a computer system, or a computer-readable apparatus including a storage medium storing computer-readable and/or computer-executable instructions that are configured to, when executed by a processor apparatus, cause the at least one processor apparatus or another computerized apparatus to perform the operations. Example components of a computerized apparatus or system are illustrated in FIG. 11, which are described in more detail below.

It should also be noted that the operations of the method 600 may be performed in any suitable order, not necessarily the order depicted in FIG. 6. Further, the method 600 may include additional or fewer operations than those depicted in FIG. 6 to accomplish the synchronous ATPG.

At step 602, the method 600 may include initializing, by the ATPG manager, a fault state of the ATPG manager to a default status for all faults. This may be performed at the beginning of ATPG. The default fault state may be an initial fault state that include zeros, blank data, null data, or other initial "blank slate" values. The default state may refer to a state where faults are either labeled as undetected, requiring test patterns to be generated to test the faults, or identified as untestable. They can also include lists of faults that had been previously tested using other methods, or prior pattern generation processes.

At step 604, the method 600 may include instructing a plurality of ATPG workers to begin an ATPG process, which includes test-pattern generation by the ATPG workers. The plurality of ATPG workers may be managed by an ATPG manager (e.g., 102, 112) and/or at least one more secondary ATPG manager (e.g., 112a). In some embodiments, a new interval may be started by instructing all ATPG workers to start test-pattern generation. Depending on the implementation, there may be multiple ATPG workers, e.g., 4, 8, 12, 16, 32, 100, or others as feasible; and the ATPG workers may utilize multiple threads (e.g., 4, 8, 16, 32, or other quantities as feasible). Given the contents of the disclosure, it may be feasible to scale to great numbers the number of workers under management of an ATPG manager or managers, and computational resources used by the ATPG workers, such as central processing units (CPUs), threads, memory, even graphics processing units (GPUs).

At step 606, the method 600 may include listening for a signal indicative of a threshold (e.g., minimum) pattern generated from one or more of the plurality of ATPG workers. In some embodiments, the ATPG manager may wait for signals (including minimum pattern limit signals) to be communicated and received from any of the one or more ATPG workers. Such signals may indicate that a worker has completed generating at least (i.e., at a minimum) an interval's worth of patterns and performing fault simulation on the generated patterns. In some implementations, an interval may be defined based on an amount of memory (e.g., 32 bits of patterns), or in cases where different patterns take different amounts of memory, based on a number of patterns. In some cases, an interval may be an interval of time.

Work performed during periods 406a, 410a, 406b, 406n (as depicted in FIG. 4) may each be an example of an interval's worth of fault simulations performed on patterns generated by the respective ATPG worker. The work performed may take varying amounts of time, as depicted in FIG. 4.

At step 608, the method 600 may include determining whether the threshold criterion (e.g., minimum quantity of test patterns) is reached by the one or more ATPG workers. In some embodiments, the minimum pattern criterion may include a minimum pattern generation target quantity. In some implementations, the minimum target for a given ATPG worker may be modified (e.g., increased or decreased) during ATPG using ad hoc or machine learning techniques as described elsewhere above. In some implementations, a maximum target or criterion may be set as well.

If the minimum pattern criterion has not been met, the ATPG manager may continue listening for the signal indicative of the minimum pattern generated from an ATPG worker (step 606). If the respective minimum pattern criterion has met by all ATPG workers (e.g., a particular ATPG worker has met its minimum generation target), the ATPG manager may instruct all ATPG worker meeting the criterion to pause or stop pattern generation (at step 610). In some implementations, when a worker completes its work reaching its minimum pattern criteria, the ATPG manager may mark the worker in order to track when all workers finish. If at least one of the plurality of ATPG workers managed by the ATPG manager is still performing work, then paused or stopped ATPG worker may subsequently generate another interval's worth of patterns and perform fault simulation thereon. Work performed by ATPG worker 404a during period 410a in FIG. 4 may be a specific example of the subsequent interval. In this example, ATPG worker 404a may continue with further work, with two more intervals after period 410a as shown in FIG. 4.

In some embodiments, the minimum pattern criterion may be that all ATPG workers having completed at least one interval. For example, referring again to FIG. 4, at time $t_1$, all ATPG workers 404a-404x have completed at least one interval. In this example, ATPG worker 404b is the last one to complete an interval. Prior to this point, the minimum pattern criterion may not be met. In some variants, the number of requisite intervals to meet the terminating criterion may vary.

At step 612, the method 600 may include combining new fault detections from all ATPG workers. In some embodiments, the ATPG manager may gather information relating to fault simulation results from the ATPG worker or workers that have communicated its completion of work. That is, there may not be updates from all ATPG workers, just those that have completed fault detections and reported them. All the same, the fault state of the ATPG manager may be updated with the new information regarding the new fault detections.

At step 614, the method 600 may include assigning duplicate fault detections to specific ATPG workers. In many cases, the ATPG mechanism should endeavor to detect faults only once in order to reduce duplication of work—although in some cases, redundancy may be valuable for verifying the existence of certain or all faults. In some implementations, the ATPG manager may determine which faults are detected by only one worker and which faults are detected by several workers. For faults that are detected by several workers, the ATPG manager may select a worker to give fault detection credit to as discussed elsewhere above, e.g., based on a priority list of workers, a first-come-first-served approach, a random or pseudorandom determination, or another approach.

At step 616, the method 600 may include sending fault updates to ATPG workers, uniquely identifying other workers' detected faults to each ATPG worker. This step is what the present disclosure refers to as synchronization. In some embodiments, the ATPG manager may update all ATPG workers with the faults detected by other workers. In some implementation, this information may include further information such as the faults that were detected by several workers and given credit to a single worker.

At step 618, the method 600 may include determining whether a terminating criterion is reached. In some embodiments, terminating criterion may include all ATPG workers having completed a certain number of intervals, e.g., where the threshold (e.g., minimum) pattern criterion is reached. In some variants, the number of requisite intervals to meet the terminating criterion may be at least one but may also be higher. In some embodiments, other terminating criterion may alternatively or additionally be required, e.g., an amount of duplicate faults detected, an amount of test patterns generated by each ATPG worker, completion of assigned work by all ATPG workers, an amount of fault detections made by each ATPG worker, total number of patterns generated, total fault coverage achieved, lack of additional fault detection progress (flat tail termination).

Before the terminating criterion is reached, the ATPG manager may continue to listen for signals from the ATPG workers and send fault updates to ATPG workers based on newly detected fault detections.

If the terminating criterion is reached, the method 600 may include signaling all workers to stop, and collecting all generated patterns at step 620.

Figure 7:
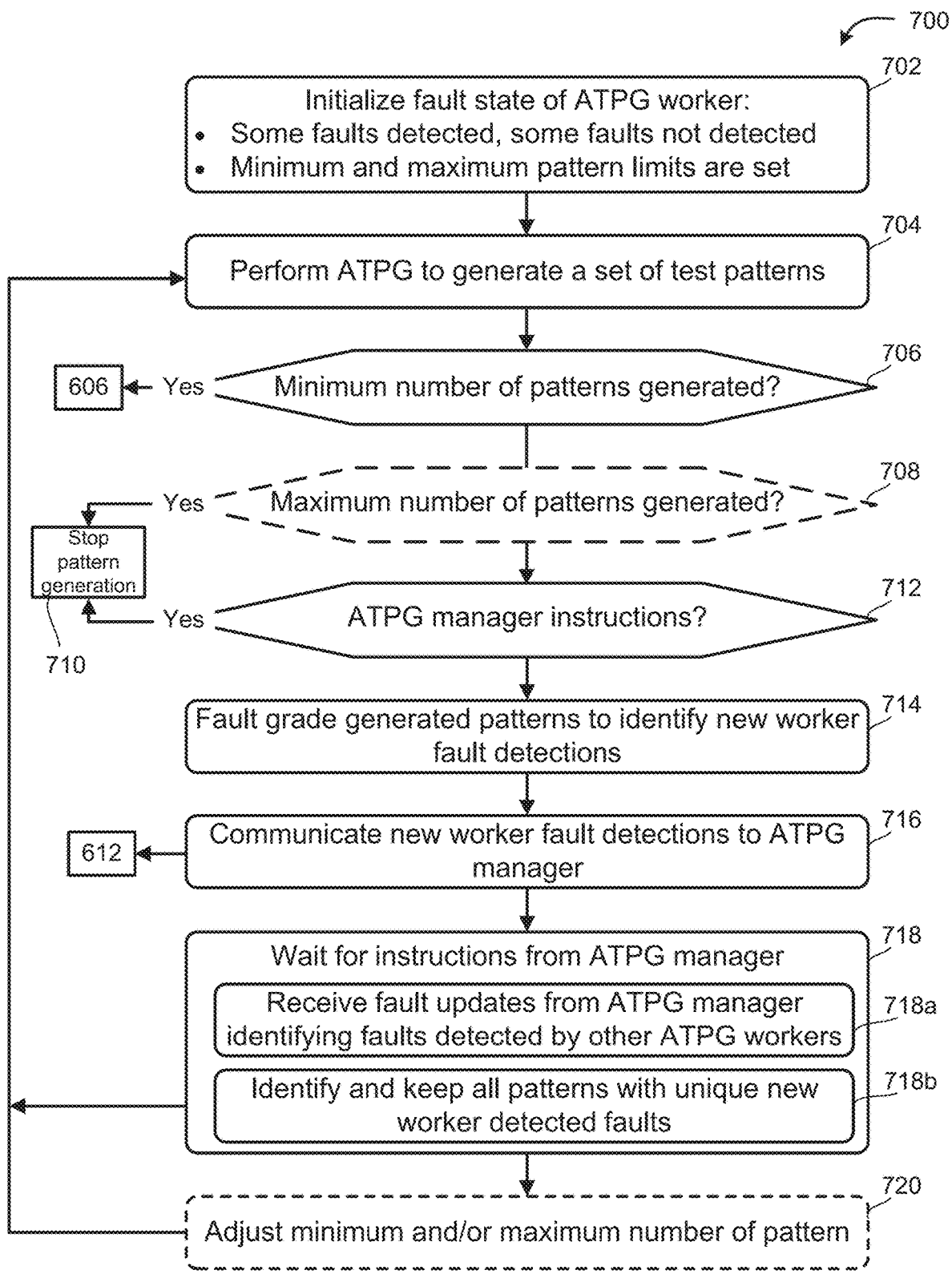
FIG. 7 is a flow diagram illustrating an example methodology for performing a synchronous ATPG by an ATPG worker, according to some embodiments.

FIG. 7 is a flow diagram illustrating a methodology 700 for performing a synchronous automatic test-pattern generation (ATPG) by an ATPG worker, according to some embodiments. One or more of the functions of the method 700 may be performed by a computerized apparatus or system. Means for performing the functionality illustrated in one or more of the steps shown in FIG. 7 may include hardware and/or software components of such computerized apparatus or system, such as, for example, a device, a computer system, or a computer-readable apparatus including a storage medium storing computer-readable and/or computer-executable instructions that are configured to, when executed by a processor apparatus, cause the at least one processor apparatus or another computerized apparatus to perform the operations. Example components of a computerized apparatus or system are illustrated in FIG. 11, which are described in more detail below.

It should also be noted that the operations of the method 700 may be performed in any suitable order, not necessarily the order depicted in FIG. 7. Further, the method 700 may include additional or fewer operations than those depicted in FIG. 7 to accomplish the synchronous ATPG.

At step 702, the method 700 may include initializing a fault state of the ATPG worker. A given ATPG worker may have a fault state that indicates that some faults are detected and some faults are not detected. In some embodiments, the initializing of the fault state may include setting the fault state of the ATPG worker to the initial fault state of the ATPG manager. The default fault state may be an initial fault state that include zeros, blank data, null data, or other initial "blank slate" values. The fault state may thus be an initial fault state like the ATPG manager's fault state, where the majority of faults are not detected, a few faults might be identified as detected by implication, and a few faults identified as untestable. It can also include faults that had been previously tested using other methods, or prior pattern generation processes. In addition, in some embodiments, the ATPG Workers may also be initialized with a minimum pattern generation limit and/or a maximum pattern generation limit.

At step 704, the method 700 may include performing ATPG to generate a set of test patterns. In some embodiments, the ATPG worker may generate an interval's worth of patterns. In some cases, an interval may be defined based on an amount of memory (e.g., 32 bits of patterns), or in cases where different patterns take different amounts of memory, based on a number of patterns. In some cases, an interval may be an interval of time. The test-pattern generation by the ATPG worker may take seconds or minutes, or in rare cases, hours, depending on the complexity of design of the circuit being tested, or the ATPG configuration.

In some embodiments, a plurality of other ATPG workers may be independently generating test patterns in parallel to a given ATPG worker. The work may be distributed across the ATPG workers and managed by the ATPG manager. Depending on the implementation, the number of ATPG workers managed by the ATPG manager may vary, e.g., 4, 8, 12, 16, 32, 100, or other quantities as feasible; and the ATPG workers may utilize multiple threads (e.g., 4, 8, 16, 32, or other quantities as feasible). The approaches described herein are scalable to a large distribution of ATPG workers. As described elsewhere herein, the ATPG manager may be configured to observe and listen to the work performed by each ATPG worker and use time and computing resources more efficiently such that the ATPG workers do not experience excessive idleness.

To that end, at step 706, the method 700 may include determining whether a threshold quantity of test patterns (e.g., minimum of number of patterns) has been generated. If so, the ATPG worker may send a signal to the ATPG manager. Responsive to this signal, the ATPG manager listening for the signal (at step 606) may proceed to confirm whether a threshold criterion (e.g., minimum quantity of test patterns) has been reached (step 608). If the minimum of number of patterns has not been generated, the ATPG worker may continue performing ATPG to generate more test patterns (step 704).

At step 708, the method 700 may include determining whether another threshold quantity (e.g., maximum of number of patterns) has been generated. Preventing too much test-pattern generation may advantageously aid in reducing overlapping duplicate work with other ATPG workers. In some embodiments, this step may be optional, and only the minimum number of patterns need be met or exceeded before the next step occurs.

At step 710, the method 700 may include stopping pattern generation based on the minimum number of patterns being generated and/or the maximum number of patterns being generated. In some cases, pattern generation may be stopped when instructed (at step 712) by the ATPG manager based on the minimum pattern criterion (step 608).

At step 714, the method 700 may include detecting faults in the generated set of test patterns. In some embodiments, detecting the faults may include fault grading the generated test patterns to identify new worker fault detections. As is known in the relevant arts, fault grading may refer to a procedure that determines what portion of a list of particular manufacturing defects or faults will be detected if a test (e.g., test vector set) is run on a device. Fault grading does not verify that a device meets a design specification, only that the device was manufactured according to the instructions used to manufacture the device. It indicates testability by relating the number of fabrication defects or faults that can be detected to the total number of conceivable faults. The ATPG worker may update its fault state based on the faults detected.

At step 716, the method 700 may include communicating new fault detections by the ATPG worker to the ATPG manager. This may lead to step 612 of FIG. 6.

At step 718, the method 700 may include waiting for instructions from the ATPG manager. In some scenarios, the ATPG worker may proceed to step 718a, where it may receive fault updates from the ATPG manager, which may identify faults detected by the other ATPG workers during the interval of step 704 (step 616). At step 718b, the ATPG worker may identify and keep all patterns with the new detected faults by the other ATPG workers. In some implementations, the fault state of the worker may be updated with the faults detected by the other ATPG workers, such that the fault state of the ATPG manager and the ATPG worker may be synchronized. In this way, the ATPG worker can selectively ignore or discard test patterns that include faults the other workers have already tested (e.g., as part of pattern generation and fault simulation on other worker) and/or discard faults that the other worker have already detected. Synchronization may thus include the above steps 718 through 718b.

In some scenarios, the ATPG worker may return to step 704 and generate another set of patterns while other workers to continue to work on generating their first or current pattern interval. Optionally, in some embodiments, at step 720, the method 700 may include adjusting the threshold (e.g., minimum of number of patterns and/or the maximum of number of patterns), before returning to step 704. In this way, productivity and time-efficiency can be enhanced. This is contrasted with ATPG where the ATPG workers wait for every other worker to complete its work, as shown in FIG. 2.

To illustrate with an example, referring back to FIG. 4, after the ATPG worker 404a completes its interval of work (pattern generation and fault detection), it may receive fault updates from the ATPG manager (step 718a). In some cases, the ATPG worker 404a may receive the fault updates during the period 408 when it is not performing work. If one or more other workers have not completed at least one interval, as is the case for the ATPG worker 404b, the ATPG worker 404a may generate another pattern interval, e.g., during period 410a. In the FIG. 4 example, the ATPG worker 404a generates two additional intervals of test patterns. Using the updated fault state, the ATPG worker 404a may discard test patterns and/or faults detected by the other ATPG workers. From the perspective of the ATPG worker 404b, however, it does not return to step 704 because it is the last worker to complete ATPG. The fault state of the ATPG worker 404b may still be updated with the new detected faults, bringing all ATPG workers to the same fault state, e.g., at time $t_1$.

Figure 8:
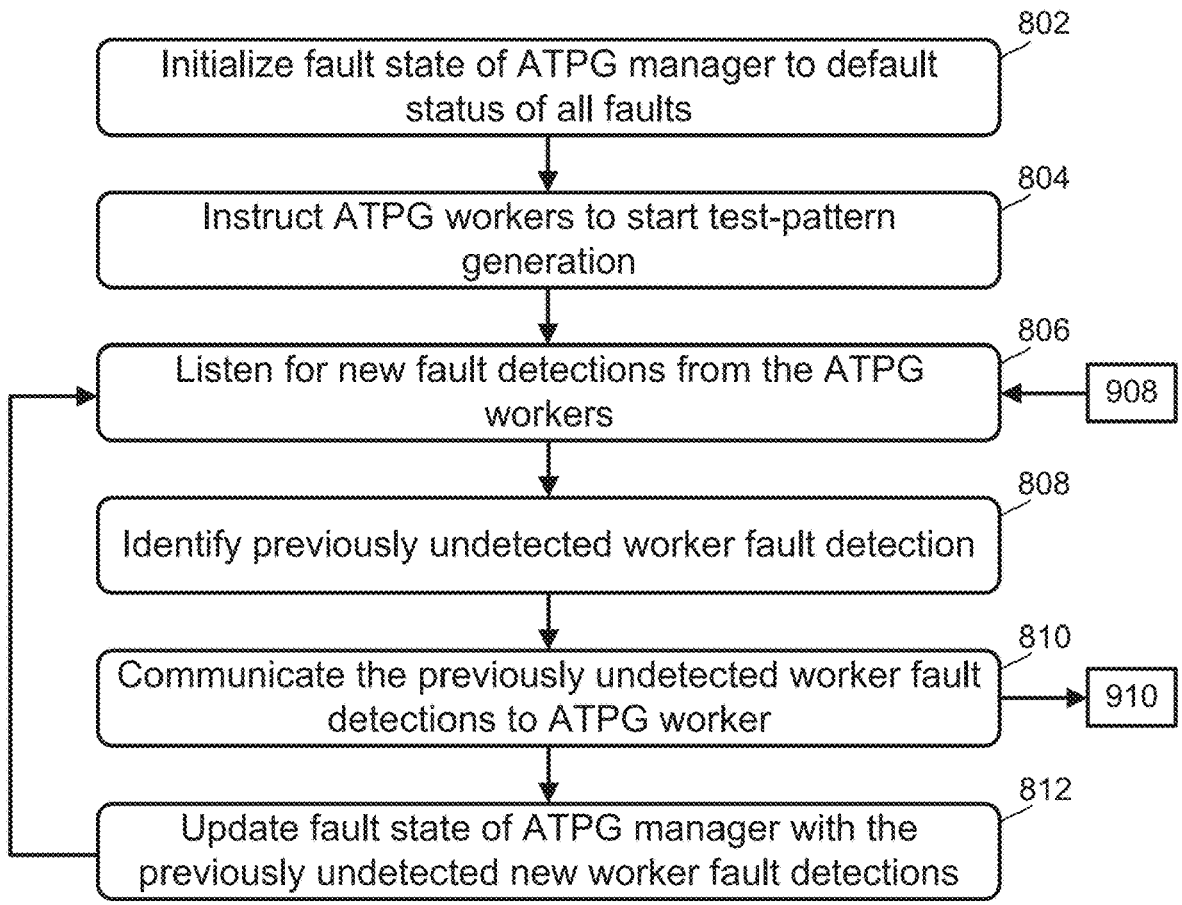
FIG. 8 is a flow diagram illustrating an example methodology for performing an asynchronous ATPG by an ATPG manager, according to some embodiments.

FIG. 8 is a flow diagram illustrating a methodology 800 for performing an asynchronous automatic test-pattern generation (ATPG) by an ATPG manager, according to some embodiments. One or more of the functions of the method 800 may be performed by a computerized apparatus or system. Means for performing the functionality illustrated in one or more of the steps shown in FIG. 8 may include hardware and/or software components of such computerized apparatus or system, such as, for example, a device, a computer system, or a computer-readable apparatus including a storage medium storing computer-readable and/or computer-executable instructions that are configured to, when executed by a processor apparatus, cause the at least one processor apparatus or another computerized apparatus to perform the operations. Example components of a computerized apparatus or system are illustrated in FIG. 11, which are described in more detail below.

It should also be noted that the operations of the method 800 may be performed in any suitable order, not necessarily the order depicted in FIG. 8. Further, the method 800 may include additional or fewer operations than those depicted in FIG. 8 to accomplish the synchronous ATPG.

At step 802, the method 800 may include initializing, by the ATPG manager, a fault state of the ATPG manager to a default status for all faults. This may be performed at the beginning of ATPG. The default fault state may be an initial fault state that include zeros, blank data, null data, or other initial "blank slate" values. The default state may refer to a state where faults are either labeled as undetected, requiring test patterns to be generated to test the faults, a few faults might be identified as detected by implication, and a few faults identified as untestable. It can also include faults that had been previously tested using other methods, or prior pattern generation processes.

At step 804, the method 800 may include instructing a plurality of ATPG workers to start test-pattern generation. In some embodiments, all of these instructed ATPG workers may be managed by the ATPG manager. Depending on the implementation, there may be multiple ATPG workers, e.g., 4, 8, 12, 16, 32, 100, or other quantities as feasible; and the ATPG workers may utilize multiple threads (e.g., 4, 8, 16, 32, or other quantities as feasible). In some cases, only a subset of the ATPG workers managed by the ATPG manager may be instructed to begin test-pattern generation.

At step 806, the method 800 may include listening for new fault detections from the plurality of ATPG workers instructed. During this time, one or more ATPG workers may send a signal to the ATPG manager indicating that they have completed a pattern generation interval. Responsive to the ATPG manager receiving this message, the ATPG manager may request fault simulation results from ATPG worker(s).

At step 808, the method 800 may include identifying previously undetected fault detections. In some embodiments, the ATPG manager may determine, for a given ATPG worker, which faults have not already been detected and which may have already been processed by other ATPG workers. That is, the ATPG manager may identify fault detections that are not known by particular ATPG workers. In some implementations, the ATPG manager may also determine which faults have been detected by only one worker, and if more than one worker is being processed at the same time, determine which faults are detected by more than one worker. For faults that are detected by more than one worker, the ATPG manager may select a worker to give fault detection credit to, e.g., using any of the approaches noted elsewhere above.

At step 810, the method 800 may include communicating the previously undetected fault detections to one or more ATPG workers. As an example, refer back to FIG. 5A, in which the ATPG manager may update the fault states of one or more ATPG workers during a synchronization period during which the ATPG manager may communicate the information regarding the previously undetected fault detections to the ATPG worker(s). In some embodiments, any ATPG workers that message the ATPG manager (step 806) may be queued while the ATPG manager processes the open request(s). In some implementations, the ATPG manager may wait for a prescribed criterion to be met before updating the fault states of ATPG workers, as discussed above with respect to FIG. 5B. In some variations, the ATPG manager will wait until a certain number of intervals is ready before allowing the ATPG workers to return to generating a new interval of patterns before synchronization occurs.

At step 812, the method 800 may include updating a current fault state of the ATPG manager with information on the previously undetected new worker fault detections, and continue listening for new fault detections from the ATPG workers (step 806).

In some embodiments, returning to step 806, the ATPG manager may instruct at least some ATPG workers to perform another, subsequent pass of fault simulations.

The ATPG manager may collect new pattern generations and fault simulation results from the subsequent pass of fault simulation, from each worker (step 808). In some implementations, this collection can happen at the very end of the ATPG process, provided that each ATPG worker keeps track of patterns and communicates all patterns and fault simulation results so that it can communicate this information. ATPG workers may be associated with a memory or buffer that can store this information. If a queue has a message from a worker, the ATPG manager may attend to processing the queued workers, or if the queue is empty, listen for new messages from workers.

Figure 9:
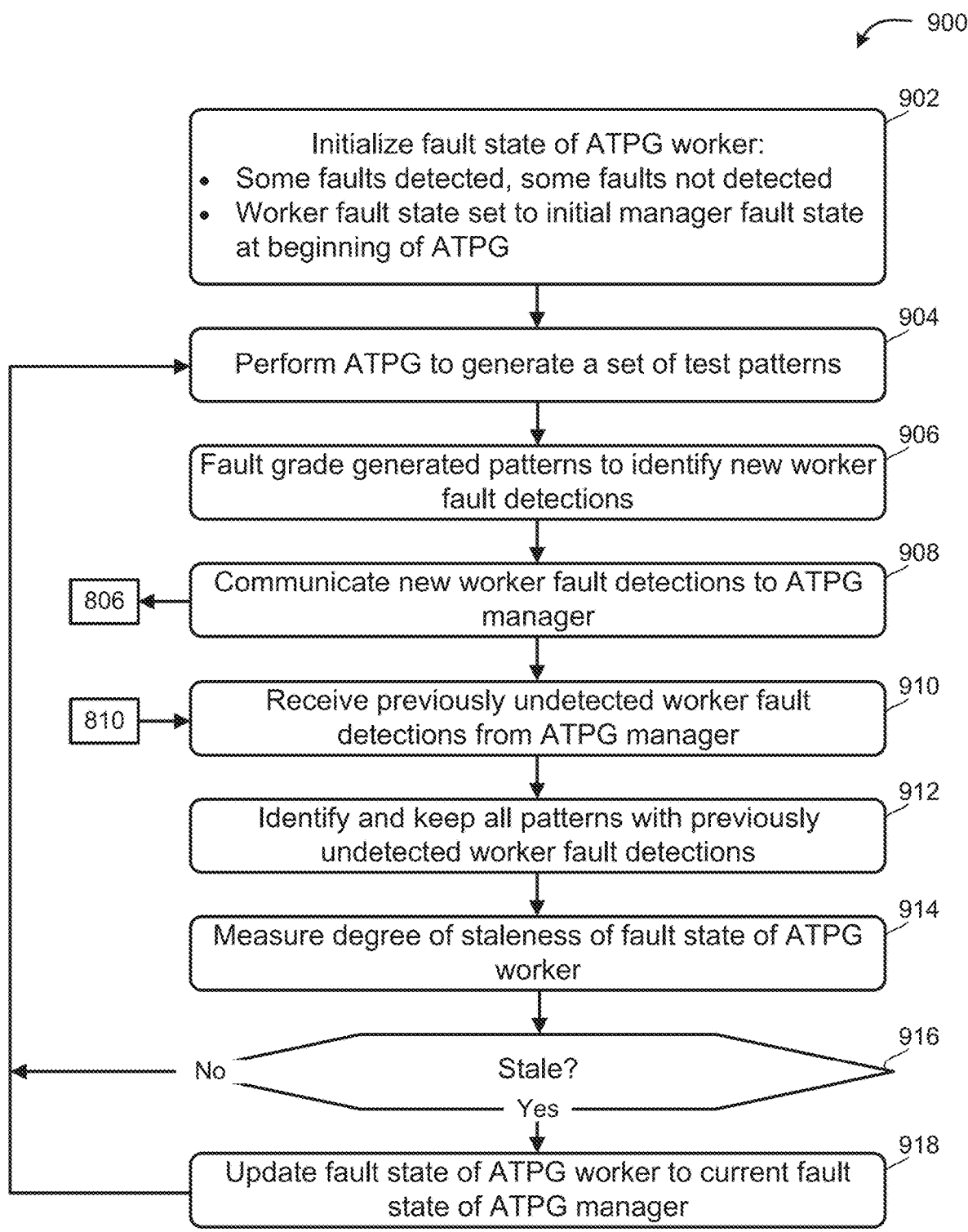
FIG. 9 is a flow diagram illustrating an example methodology for performing an asynchronous ATPG by an ATPG worker, according to some embodiments.

This approach of consolidating ATPG worker faults and patterns at asynchronous intervals and updating ATPG workers "on demand" or as soon as they complete their task of pattern generation and fault detection can enhance time and memory efficiency. It can allow ATPG workers to make progress in performing ATPG at their own pace. For instance, the memory buffer need not carry more than single interval of data because the interval is processed each time it is completed by an ATPG worker. The asynchronous approach also need not wait for all ATPG workers from completing its first interval before synchronizing the fault with information regarding all of the other workers. However, the asynchronous approach may require more communication resources and synchronization time between ATPG manager and workers than the synchronous approach such as that described with respect to FIGS. 6 and 7. The asynchronous approach may be more advantageous when there is a large variance in worker productivity or capability, or high-difficulty faults that demand a relatively longer time for a worker to process. In order to limit communications, ATPG workers can synchronize fault information with the ATPG manager when an ATPG worker identifies that its fault state has become too stale, causing duplication of ATPG efforts. FIG. 9 illustrates steps taken by the ATPG worker.

FIG. 9 is a flow diagram illustrating a methodology 900 for performing an asynchronous automatic test-pattern generation (ATPG) by an ATPG worker, according to some embodiments. One or more of the functions of the method 900 may be performed by a computerized apparatus or system. Means for performing the functionality illustrated in one or more of the steps shown in FIG. 9 may include hardware and/or software components of such computerized apparatus or system, such as, for example, a device, a computer system, or a computer-readable apparatus including a storage medium storing computer-readable and/or computer-executable instructions that are configured to, when executed by a processor apparatus, cause the at least one processor apparatus or another computerized apparatus to perform the operations. Example components of a computerized apparatus or system are illustrated in FIG. 11, which are described in more detail below.

It should also be noted that the operations of the method 900 may be performed in any suitable order, not necessarily the order depicted in FIG. 9. Further, the method 900 may include additional or fewer operations than those depicted in FIG. 9 to accomplish the synchronous ATPG.

At step 902, the method 900 may include initializing a fault state of an ATPG worker. A given ATPG worker may have a fault state that indicates that some faults are detected and some faults are not detected. In some embodiments, the initializing of the fault state may include setting the fault state of the ATPG worker to the initial fault state of the ATPG manager. The default fault state may be an initial fault state that include zeros, blank data, null data, or other initial "blank slate" values. The fault state may thus be an initial fault state like the ATPG manager's fault state, where the majority of faults are not detected, a few faults might be identified as detected by implication, and a few faults identified as untestable. It can also include faults that had been previously tested using other methods, or prior pattern generation processes.

At step 904, the method 900 may include performing ATPG to generate a set of test patterns. In some embodiments, the ATPG worker may generate an interval's worth of patterns. In some cases, an interval may be defined based on an amount of memory (e.g., 32 bits of patterns), or in cases where different patterns take different amounts of memory, based on a number of patterns. In some cases, an interval may be an interval of time. The test-pattern generation by the ATPG worker may take seconds or minutes, or in rare cases, hours, depending on the complexity of design of the circuit being tested, or the ATPG configuration.

In some embodiments, a plurality of other ATPG workers may be independently generating test patterns in parallel to a given ATPG worker. The work may be distributed across the ATPG workers and managed by the ATPG manager. Depending on the implementation, the number of ATPG workers managed by the ATPG manager may vary, e.g., 4, 8, 12, 16, 32, 100, or other quantities as feasible; and the ATPG workers may utilize multiple threads (e.g., 4, 8, 16, 32, or other quantities as feasible). The approaches described herein are scalable to a large distribution of ATPG workers. As described elsewhere herein, the ATPG manager may be configured to observe and listen to the work performed by each ATPG worker and use time and computing resources more efficiently such that the ATPG workers do not experience excessive idleness.

At step 906, the method 900 may include detecting faults in the generated set of test patterns. In some embodiments, detecting the faults may include fault grading the generated test patterns to identify new worker fault detections. The ATPG worker may update its fault state based on the faults detected.

At step 908, the method 900 may include communicating results of new fault detections by the ATPG worker to the ATPG manager. This may lead to step 806 of FIG. 8, where the ATPG manager listening for new fault detections may identify previously undetected fault detections (at step 808).

At step 910, the method 900 may include receiving fault updates from the ATPG manager. In some embodiments, the fault updates may arrive while waiting for the ATPG manager to update the ATPG worker and inform which fault detections are new and can be taken credit for when performing a subsequent fault simulation by the ATPG worker. At step 912, the ATPG worker may identify and keep all patterns with the new detected faults.

At step 914, the method 900 may include measuring a degree of staleness of the fault state of the ATPG worker. As discussed above, the ATPG worker's fault state may be determined to be stale based on, e.g., an amount of difference between an ATPG worker's fault state and the ATPG manager's fault state relative to a threshold, or an amount of coverage of test patterns relative to a prescribed threshold amount of test patterns generated by an ATPG worker. For instance, the worker fault state may be considered stale if the coverage of newly detected faults associated with test patterns generated by an ATPG worker does not exceed a threshold amount. Alternatively, if the coverage of duplicate faults detected by the ATPG worker exceeds a threshold amount, the fault state of the worker may be considered stale. Since the ATPG manager is aware of the patterns generated and the faults detected, the threshold may be based on this knowledge. That is, the threshold may increase or decrease depending on the extent of faults discovered.

At step 916, if the fault state of the ATPG worker is stale, the method 900 may proceed to step 918 to update the fault state of the ATPG worker to the current fault state of the ATPG manager (from step 812). If not stale, return to step 904 to generate more test patterns.

In some implementations, the fault state of the worker may be updated with information relating to the faults detected by the other ATPG workers, such that the fault state of the ATPG manager and the ATPG workers may be synchronized. In this way, the ATPG worker can selectively ignore or discard test patterns that the other workers have already identified (e.g., as generating faults) and/or discard faults that the other worker have already detected.

Figure 10:
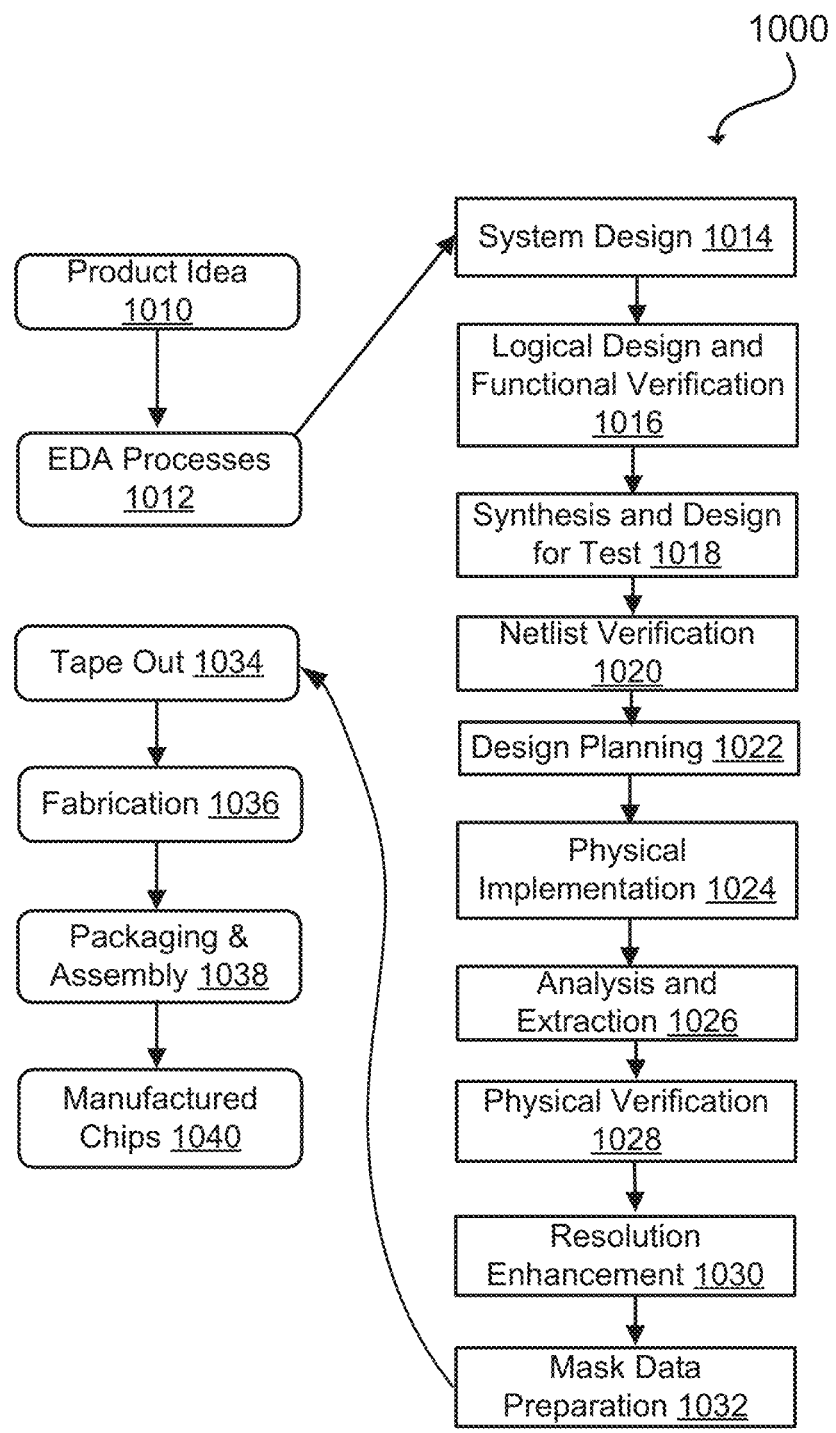
FIG. 10 depicts a flowchart of various processes used during the design and manufacture of an integrated circuit which may be used with some embodiments of the present disclosure.

FIG. 10 illustrates an example set of processes 1000 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1010 with information supplied by a designer, information which is transformed to create an article of manufacture that uses a set of EDA processes 1012. When the design is finalized, the design is taped-out 1034, which is when artwork (e.g., geometric patterns) for the integrated circuit is sent to a fabrication facility to manufacture the mask set, which is then used to manufacture the integrated circuit. After tape-out, a semiconductor die is fabricated 1036 and packaging and assembly processes 1038 are performed to produce the finished integrated circuit 1040.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). The processes described may be enabled by EDA products (or tools).

During system design 1014, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1016, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1018, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1020, the netlist is checked for compliance with timing constraints and for correspondence with the HDL code. During design planning 1022, an overall floor plan for the integrated circuit is constructed and analyzed for timing and top-level routing.

During layout or physical implementation 1024, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1026, the circuit function is verified at the layout level, which permits refinement of the layout design. During physical verification 1028, the layout design is checked to ensure that manufacturing constraints are correct, such as DRC constraints, electrical constraints, lithographic constraints, and that circuitry function matches the HDL design specification. During resolution enhancement 1030, the geometry of the layout is transformed to improve how the circuit design is manufactured.

During tape-out, data is created to be used (after lithographic enhancements are applied if appropriate) for production of lithography masks. During mask data preparation 1032, the 'tape-out' data is used to produce lithography masks that are used to produce finished integrated circuits.

A storage subsystem of a computer system (such as computer system 1100 of FIG. 11) may be used to store the programs and data structures that are used by some or all of the EDA products described herein, and products used for development of cells for the library and for physical and logical design that use the library.

Apparatus

FIG. 11 illustrates an example machine of a computer system 1100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the machine shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method for performing an asynchronous automatic test-pattern generation (ATPG) by an ATPG machine, the method comprising:
generating a set of test patterns;
detecting one or more faults associated with the set of test patterns;
communicating information relating to the detected one or more faults to an ATPG manager, the ATPG manager configured to communicate with one or more other ATPG machines; and
based on a degree of staleness of a fault state of the ATPG machine, updating the fault state of the ATPG machine to a fault state of the ATPG manager, the fault state of the ATPG manager representative of faults detected by the ATPG machine and the one or more other ATPG machines.

2. The method of claim 1, further comprising determining the degree of staleness based on a difference between the fault state of the ATPG machine and the fault state of the ATPG manager, a quantity of newly detected faults in the detected one or more faults not exceeding a threshold amount, a quantity of duplicate faults in the detected one or more faults exceeding a threshold amount, or a combination thereof.

3. The method of claim 2, further comprising obtaining, from the ATPG manager, information relating to the newly detected faults.

4. The method of claim 1, further comprising updating the fault state of the ATPG machine based on the detected one or more faults.

5. The method of claim 1, further comprising generating a second set of test patterns before another one of the one or more other ATPG machines has communicated respective one or more fault detections to the ATPG manager.

6. The method of claim 1, further comprising, prior to communicating the information relating to the detected one or more faults to the ATPG manager, queuing the information relating to the detected one or more faults until the ATPG manager initiates a synchronization according to a prescribed criterion.

7. The method of claim 6, wherein the prescribed criterion comprises a threshold quantity of ATPG machines in communication with the ATPG manager that have completed a fault simulation, at least one of the ATPG machines completing more than one fault simulation, a period of time, a selected one of the ATPG machines completing the fault simulation, an amount of work done by the ATPG machines, or a combination thereof.

8. A system for automatic test-pattern generation (ATPG), the system comprising:
one or more memory components;
one or more processors coupled to the one or more memory components, the one or more processors configured to:
instruct a plurality of ATPG workers to generate a first set of test patterns and detect faults associated with the first set of test patterns;
receive fault detections from one or more of the plurality of ATPG workers;
based on the fault detections from the one or more ATPG workers, identify one or more fault detections previously undetected by the one or more ATPG workers; and
during a synchronization period triggered based on a prescribed criterion, communicate to the plurality of ATPG workers the one or more fault detections previously undetected by the one or more ATPG workers.

9. The system of claim 8, wherein the one or more processors are further configured to:
select at least one of the one or more ATPG workers to credit for the received fault detections; and
instruct the at least one ATPG worker to generate a second set of test patterns and detect faults associated with the second set of test patterns.

10. The system of claim 9, wherein the generation of the second set of test patterns and the detection of faults by the at least one ATPG worker is performed independently of and concurrently with the generation of the first set of test patterns and the detection of faults associated with the first set of test patterns by another one of the plurality of ATPG workers.

11. The system of claim 8, wherein:
the one or more processors are further configured to update a fault state of the ATPG manager based on the one or more fault detections previously undetected; and
the communication of the one or more fault detections to the plurality of ATPG workers comprises an update of a fault state of each of the one or more ATPG workers based on the updated fault state of the ATPG manager.

12. The system of claim 8, wherein the prescribed criterion comprises a threshold quantity of the plurality of ATPG workers that have completed the detection of faults associated with the first set of test patterns, at least one of the plurality of ATPG workers completing more than one set of fault detections associated with a set of test patterns, a period of time since the instruction to the plurality of ATPG workers to generate the first set of test patterns, completion of a set of fault detections by a selected one of the plurality of ATPG workers, an amount of fault detections performed by the plurality of ATPG workers, or a combination thereof.

13. The system of claim 8, wherein the one or more processors are further configured to:
based on the instruction from the ATPG manager, generate the first set of test patterns and detect faults associated with the first set of test patterns;
communicate information relating to the detected faults to the ATPG manager; and
based on a degree of staleness of a fault state of at least one of the plurality of ATPG workers, update the fault state of the at least one ATPG worker to a fault state of the ATPG manager, the fault state of the ATPG manager representative of the fault detections from at least the one or more ATPG workers.

14. A non-transitory computer-readable apparatus comprising a storage medium, the storage medium comprising a plurality of instructions configured to, when executed by one or more processors, cause the one or more processors to:
generate a first plurality of test patterns over a first interval;
responsive to the first plurality of test patterns meeting or exceeding a threshold quantity of test patterns, identify one or more faults associated with the first plurality of test patterns;
communicate the identified one or more faults to an automatic test-pattern generation (ATPG) manager apparatus that is configured to communicate with one or more other ATPG apparatus; and
receive information indicative of faults detected by the one or more other ATPG apparatus during the first interval.

15. The non-transitory computer-readable apparatus of claim 14, wherein the plurality of instructions are further configured to stop the generation of the first plurality of test patterns responsive to the first plurality of test patterns meeting a maximum quantity of test patterns.

16. The non-transitory computer-readable apparatus of claim 14, wherein the plurality of instructions are further configured to:
update a fault state of the ATPG manager apparatus with the information indicative of faults detected by the one or more other ATPG apparatus during the first interval; and
generate a second plurality of test patterns over a second interval based on the updated fault state of the ATPG manager apparatus.

17. The non-transitory computer-readable apparatus of claim 16, wherein the generation of the second plurality of test patterns over the second interval is performed while at least one of the one or more other ATPG apparatus is generating a plurality of test patterns over the first interval.

18. The non-transitory computer-readable apparatus of claim 16, wherein the plurality of instructions are further configured to, subsequent to the update of the fault state of the ATPG manager apparatus, and prior to the generation of the second plurality of test patterns over the second interval, adjust the threshold quantity of test patterns.

19. The non-transitory computer-readable apparatus of claim 14, wherein the ATPG manager apparatus is configured to:
receive one or more faults identified by the ATPG apparatus and the one or more other ATPG apparatus;
determine duplicate faults identified, and assign respective ones of the duplicate faults to the ATPG manager apparatus and/or the one or more other ATPG apparatus; and
send a fault update to the ATPG manager apparatus and the one or more other ATPG apparatus, the fault update uniquely identifying the assigned duplicate faults to respective ones of the ATPG manager apparatus and/or the one or more other ATPG apparatus.

20. The non-transitory computer-readable apparatus of claim 14, wherein the identification of the one or more faults associated with the first plurality of test patterns is further responsive to an instruction from the ATPG manager apparatus.

* * * * *